(12) United States Patent
Hoshi et al.

(10) Patent No.: US 7,608,864 B2
(45) Date of Patent: Oct. 27, 2009

(54) HIGH ELECTRON MOBILITY TRANSISTOR WITH MESA STRUCTURE AND REDUCED GATE LEAKAGE CURRENT

(75) Inventors: Shinichi Hoshi, Tokyo (JP); Tomoyuki Ohshima, Tokyo (JP); Hironobu Moriguchi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 203 days.

(21) Appl. No.: 11/040,016

(22) Filed: Jan. 24, 2005

(65) Prior Publication Data

US 2005/0161704 A1    Jul. 28, 2005

(30) Foreign Application Priority Data

Jan. 23, 2004   (JP)   .............................. 2004-016348

(51) Int. Cl.
*H01L 29/778*   (2006.01)
(52) U.S. Cl. ...................................... 257/194; 257/192
(58) Field of Classification Search ................. 257/194, 257/E29.246, E29.252, 192
See application file for complete search history.

(56) References Cited

U.S. PATENT DOCUMENTS 5,739,557 A * 4/1998 O'Neil et al. ............... 257/192
5,796,127 A * 8/1998 Hayafuji et al. ............. 257/194
6,329,677 B1 * 12/2001 Oguri et al. ................. 257/194

FOREIGN PATENT DOCUMENTS

JP         63017563 A  *  1/1988
JP         08-279520       10/1996

OTHER PUBLICATIONS

SandeepR. Bahl et al.,Elimination of Mesa-Sidewall Gate Leakage in InAlAs/InGaAs Heterostructuressby Selective Sidewall Recessing, IEEE Electron Device Letters vol. 13 No. 4. Apr. 1992.
A.Fathimulla ettal., High-Performance InAlAs/InGaAs HEMT's and MESFET's IEEE Electron Device Letters, vol. 9, No. 7, Jul. 1988.
April S. Brown et al., Low-Temperature Buffer AlInAs/GaInAs on InP HEMT Technology for Ultra-High-Speed Integrated Circuits, Hughes Research Laboratories, malibu, CA.

* cited by examiner

*Primary Examiner*—Matthew C Landau
*Assistant Examiner*—Candice Y Chan
(74) *Attorney, Agent, or Firm*—Kubotera & Associates, LLC

(57) ABSTRACT

The semiconductor device (10) comprises a semiinsulating substrate (12), a layered structure (20) of compound semiconductor which is a mesa structure (18) and contains an active channel layer (14), a first and a second metal main electrodes (22a, 22b) which are provided on the layered structure (20), a first and a second ion implantation regions (40a, 40b) which are provided at the depth level below the active channel layer, and a metal control electrode (26) which is provided along the channel width direction from the first ion implantation region to the second ion implantation region, crossing over the upper side of the active channel layer.

6 Claims, 29 Drawing Sheets

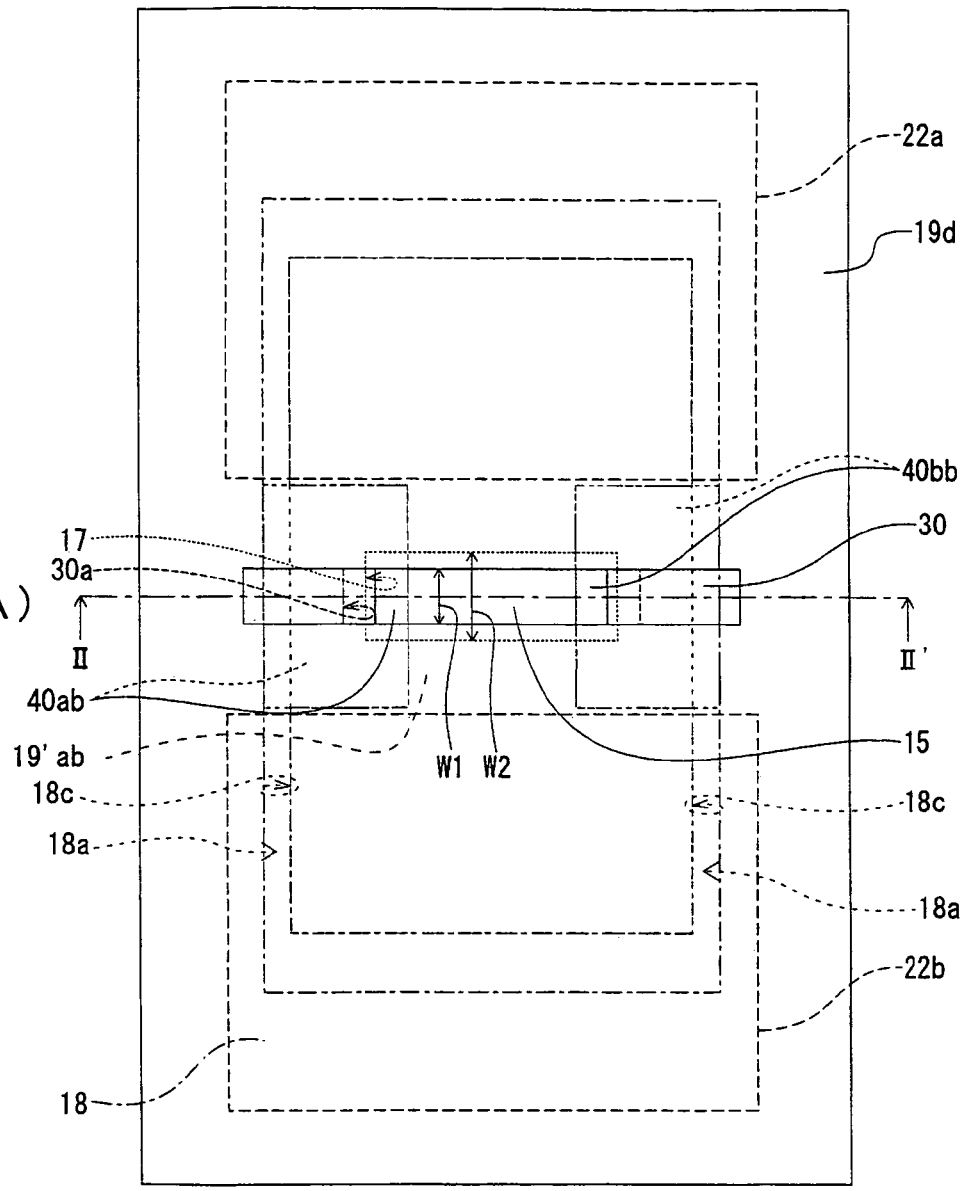
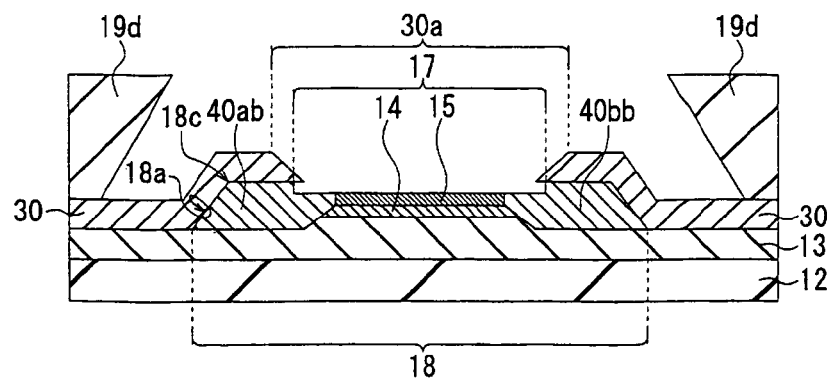
FIG.8(A)
FIG.8(B)

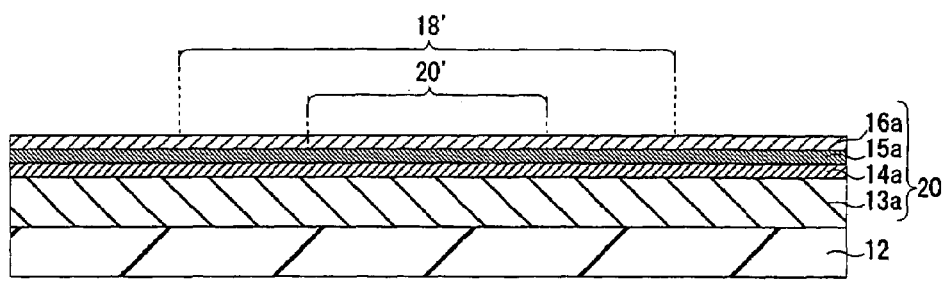
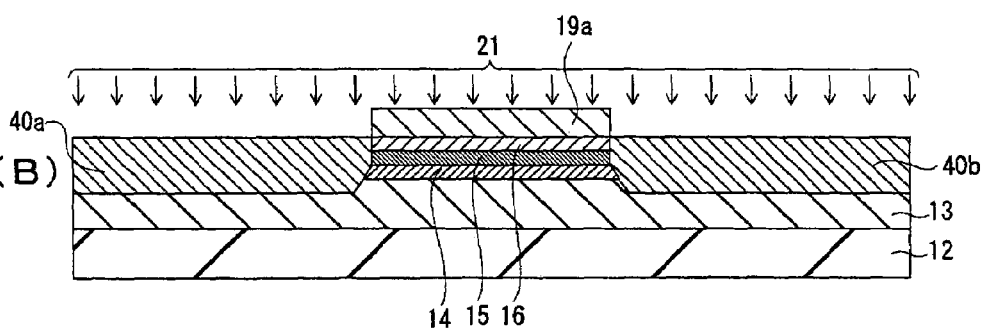
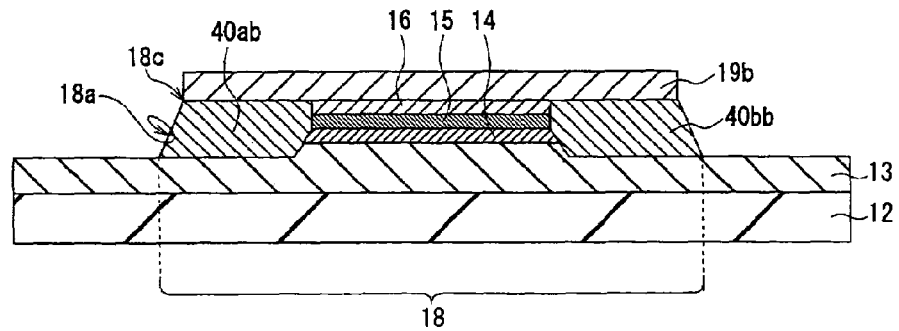

HIGH ELECTRON MOBILITY TRANSISTOR WITH MESA STRUCTURE AND REDUCED GATE LEAKAGE CURRENT

BACKGROUND OF THE INVENTION

1. Filed of the Invention

The present invention relates to a semiconductor device and its manufacturing method, especially a field effect transistor (hereinafter, also referred to as "FET") and its manufacturing method.

2. Description of the Related Art

For example, in InAlAs/InGaAs heterostructure FET, a mesa structure sometimes is employed for device isolation. In this case, if an InGaAs channel layer comes in contact with a gate electrode, gate leakage current is generated, and the performance of the device becomes dramatically degraded. As a structure to prevent the gate electrode's contacting with a sidewall formed for device isolation and InGaAs channel layer exposed from the sidewall, a constitution is known in which a recess is formed between the gate electrode and the InGaAs channel layer by selectively etching only the InGaAs channel layer (See S. R. Bahl and J. A. Alamo "Elimination of Mesa-Sidewall Gate Leakage in InAlAs/InGaAs Heterostructures by Selective Sidewall Recessing.", IEEE Electron Device Lett., Vol. 13, No. 4, p. 195, 1992).

In FET having InAlAs/InGaAs heterostructure and a mesa structure for device isolation, in order to prevent the gate electrode's coming in contact with InGaAs channel layer exposed from the mesa structure, a constitution is known, in which an air-bridge is formed between the gate electrode and the InGaAs channel layer by selectively etching only the InGaAs channel layer (See A. Fathimulla, J. Abrahams, T. Loughan and H. Hier, "High-Performance InAlAs/InGaAs HEMT's and MESFET's", IEEE Electron Device Lett., Vol. 9, No. 7, p. 328, 1988).

For performing device isolation, in order to prevent the generation of gate leakage current by avoiding the exposure of the InGaAs channel layer using a planar FET structure, constitution is known in which all the regions other than an active region is made semiinsulating by ion implantation, in place of forming a mesa structure which has a concern of increase of gate leakage current due to a contact between the InGaAs channel layer and the gate electrode (See A. S. Brown et al., "Low-Temperature Buffer AlInAs/GaInAs on Inp HEMT Technology for Ultra-high-speed Integrated Circuits," in Proc. IEEE GaAs IC Symp. 1989, p. 143).

In addition, another constitution is known, in which the InGaAs channel and the gate electrode are isolated from each other by forming a mesa structure for device isolation and then performing ion implantation onto the sidewall where the InGaAs channel layer is exposed from the mesa structure (See JP 08-279520).

For example, according to Bahl et al., the etchant used in the etching process for recessing remains in the recess between the gate electrode and the InGaAs channel layer. Since this remaining etchant usually contains an oxidizer such as hydrogen peroxide, it will oxidize the InAlAs layer which supplies electrons, so that the reliability of operation of the FET becomes reduced.

According to Fathimulla et al., since an air-bridge is formed after forming the gate electrode, etching has to be done right under the gate electrode while the gate electrode is exposed. Generally, if a semiconductor layer is etched while a gate electrode made of metal is exposed, the semiconductor layer will be abnormally etched due to a "battery effect" phenomenon. As a result characteristics of FET become degraded.

According to Brown et al., it is difficult to achieve satisfactory isolation characteristics by making all the regions other than the active region semiinsulating, in view of the band gap width.

As described above, in a field effect transistor having a mesa structure for device isolation, a constitution to effectively prevent generation of gate leakage current due to low Schottky barrier is not still realized.

SUMMARY OF THE INVENTION

Accordingly, it is an object of this invention to provide a technique to realize a semiconductor device, which effectively prevents the generation of gate leakage current while achieving satisfactory device isolation characteristics by a mesa structure.

According to the invention there is provided a semiconductor device which comprises a semiinsulating substrate, a layered structure of compound semiconductor, first and second metal main electrodes, a first and a second ion implantation regions, and a metal control electrode. The layered structure of compound semiconductor is provided on the semiinsulating substrate as a mesa structure, and contains an active channel layer. The first and the second metal main electrodes are respectively provided on the layered structure of compound semiconductor, and disposed away from each other in the channel length direction on the upper surface of the mesa structure. The first and the second ion implantation regions are regions of the mesa structure between the first and the second metal main electrodes, are disposed at the edge regions of the mesa structure facing each other in the channel width direction, and extend from the upper surface of the mesa structure to the depth level below the active channel layer. The metal control electrode is provided along the channel width direction from the first ion implantation region to the second ion implantation region, crossing over the upper surface of the active channel layer.

According to another aspect of the invention there is provided a method of manufacturing the semiconductor device which comprises the following steps.

First, a layered structure of compound semiconductor, which contains an active channel layer as the intermediate layer, is formed on a semiinsulating substrate. Then, ion implantation is performed to the layered structure. As a result, a non-ion implantation region having a first and a second expanded sections and a narrow section that connects between those expanded sections, and a first and a second ion implantation layers, which are surrounded by the non-ion implantation region and face each other across the narrow section, and extend to the depth level below the active channel layer from the surface of the layered structure, are separately formed.

Then, an inner region is set on the layered structure surface so as to include a part of the first and the second expanded regions around the narrow section and of the first and the second ion implantation layers. Then, the circumferential region that surrounds the inner region is etched until the semiinsulating substrate is exposed from the layered structure surface. As a result, a mesa structure which includes the first and the second mesa expanded sections and the first and the second mesa ion implantation regions, is formed.

Furthermore, the first and the second metal main electrodes are respectively formed on the first and the second mesa expanded sections. Thereafter, an interlayer insulating film to cover the whole upper surface of the mesa structure, on which the first and the second metal main electrodes are provided, is formed. Then, a slit first opening is formed on the interlayer insulating film, so as to extend between the first and the second metal main electrodes along a direction perpendicular to the direction connecting between the first and the second metal main electrodes, and continuously exposes a part of the surfaces of the non-ion implantation region of the narrow section and of the first and the second mesa ion implantation regions.

Moreover, a recess having larger width than that of the first opening is formed by etching a portion of the non-ion implantation region and the first and the second mesa ion implantation regions, which are exposed from the first opening to the depth level above the active channel layer. Thereafter, a metal control electrode is formed, which is upright on the bottom surface of the recess, penetrates through the first opening. Two ends of the metal electrode in the extending direction of the first opening are in the first and the second mesa ion implantation regions.

According to the invention, there is provided a semiconductor device, whereby increase of gate leakage current due to low Schottky barrier is prevented while achieving satisfactory device isolation properties by a mesa structure. Therefore, a semiconductor having improved reliability in the operation can be provided.

In addition, according to the method of manufacturing the semiconductor device of this invention, since the active channel layer is not exposed but protected by the interlayer insulating film or a resist pattern, even if the recess etching process is performed at the time of forming the metal control electrode, contamination of the active channel layer by impurities can be prevented, and therefore the reduction or loss of the performance, can be prevented.

BRIEF DESCRIPTION OF THE DRAWINGS

FIG. 8(A) is a schematic top view of the semiconductor device in the process after the one of FIG. 7(A)

FIG. 8(B) is a schematic cross-sectional view taken along the line II-II' of FIG. 8(A).

FIG. 18(A) is a schematic cross-sectional view of the semiconductor device in the manufacturing process, which is taken along the line II-II' of FIG. 17(A).

FIG. 18(B) is a schematic cross-sectional view of the semiconductor device in the manufacturing process, which is taken along the line II-II' of FIG. 17(A).

FIG. 18(C) is a schematic cross-sectional view of the semiconductor device in the manufacturing process, which is taken along the line II-II' of FIG. 17(A).

DESCRIPTION OF THE PREFERRED EMBODIMENTS

Embodiments of the invention will now be described with reference to the accompanying drawings. Here, those drawings are schematic, and provided for generally understanding the shape, size and arrangement of each element of the device. Therefore, it should be understood that the embodiments illustrated in those drawings are examples of this invention, and the scope of this invention is not limited by those drawings.

First Embodiment 1-1-1. Constitution of the Semiconductor Device

Figures 1A, 1B, 1C:
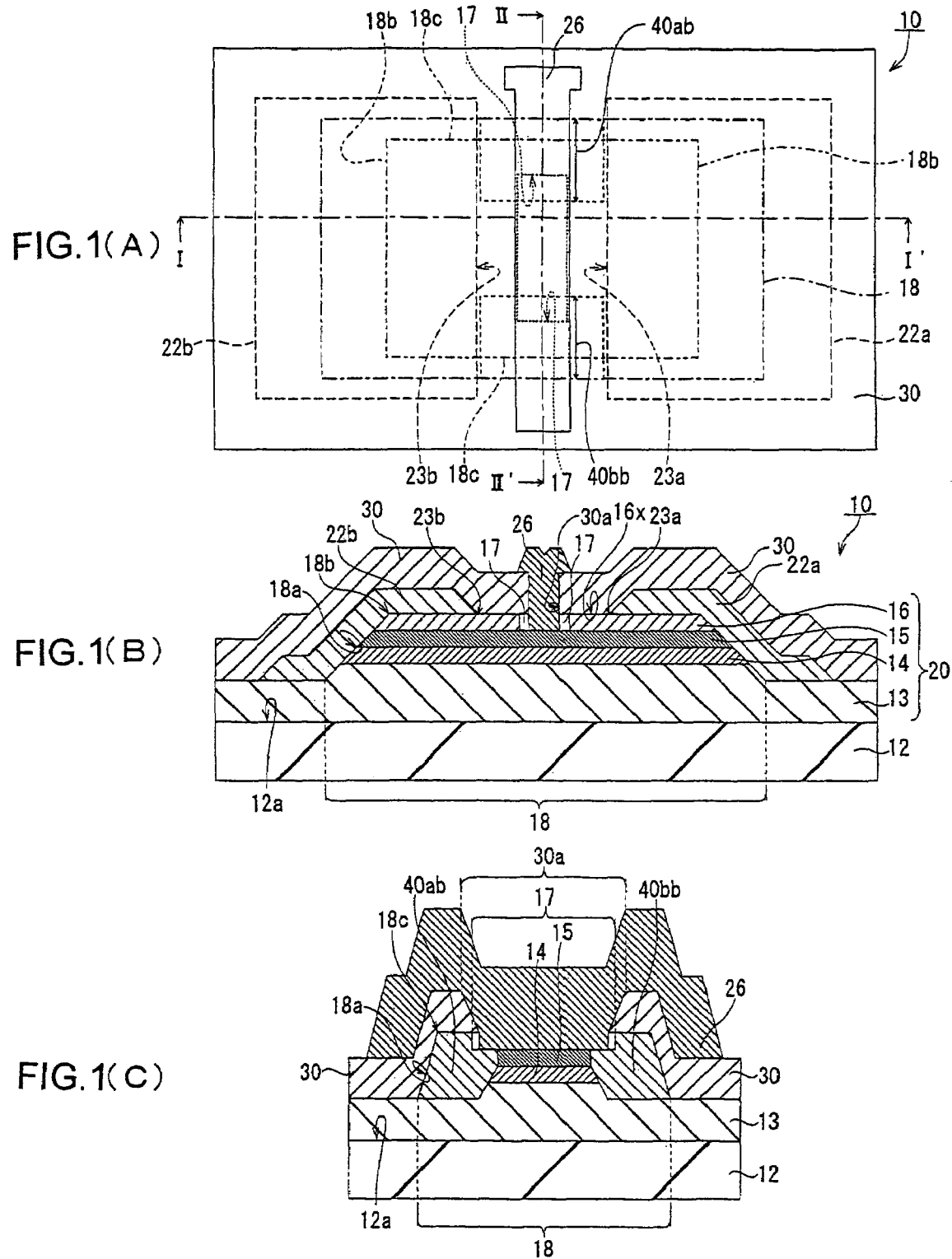
FIG. 1(A) is a schematic top view of the semiconductor device of the first embodiment, illustrating the arrangement of elements.
FIG. 1(B) is a schematic cross-sectional view taken along the line I-I' of FIG. 1(A).
FIG. 1(C) is a schematic cross-sectional view taken along the line II-II' of FIG. 1(A).

The constitution of the semiconductor device 10 of this invention is described below, referring to FIGS. 1 and 2. FIG. 1(A) is a schematic top view illustrating the arrangements of the elements, when the semiconductor device 10 formed on a substrate is viewed from the upper side. In this constitution, a single-recessed high electron mobility transistor (hereinafter, also referred to as "HEMT") on an InP substrate is described as an example of FET, which is one of semiconductor devices formed on a substrate. FIG. 1(B) is a schematic cross-sectional view taken along the line I-I' of FIG. 1(A). FIG. 1(C) is a schematic cross-sectional view taken along the line II-II' of FIG. 1(A).

The semiconductor device 10 of this invention contains a semiinsulating substrate 12. In this example, the semiinsulating substrate 12 is InP substrate 12. This semiinsulating substrate 12, however, can be any substrate, which is suitably selected depending on the design of FET (hereinafter, also referred to as "device"). A layered structure of compound semiconductor (hereinafter, also referred to as "layered structure") containing an active channel layer 14 is provided on a main surface of the semiinsulating substrate 12 (hereinafter, also simply referred to as "main surface"). This layered structure 20 of compound semiconductor has a lower layer 13, two layers 14 and 15 as intermediate layers, and an upper layer 16. In this example, InAlAs layer 13 is provided on the InP substrate, which is the semiinsulating substrate. An active channel layer 14 (i.e. electron transit layer), which is the InGaAs active channel layer 14 in this example, is provided on the InALAs buffer layer 13.

A donor layer 15 (i.e. electron supplying layer), which is InAlAs donor layer 15 in this example, is provided on the InGaAs active channel layer 14. In the example of the constitution illustrated in FIGS. 1(B) and 1(C), a single layer of InAlAs layer is illustrated as the donor layer 15, but the donor layer can be multi-layer containing a donor layer 15 as a part in place of the single layer. In case that the donor layer is multi-layer, the multi-layer can have a structure containing any suitable number of layers made of at least two types of semiconductor materials, e.g. InAlAs or InP, which has wider band gap than the channel layer 14 and can be epitaxially grown on the semiinsulating substrate.

Figure 2:
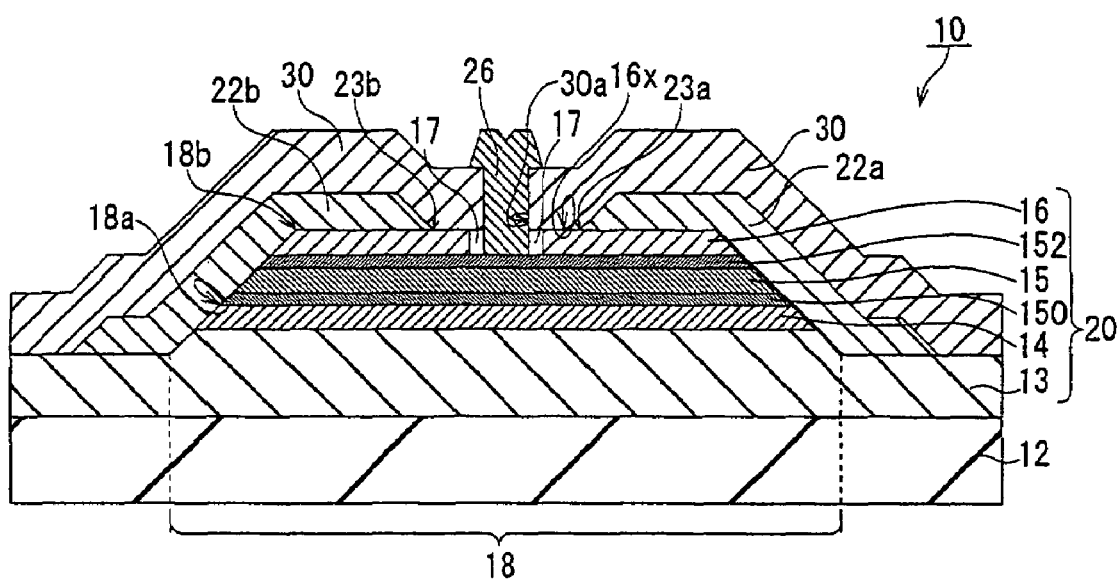
FIG. 2 is a schematic cross-sectional view of another example of the semiconductor device of the first embodiment, which is taken along the line I-I' of FIG. 1(A).

Referring now to FIG. 2, a specific example of the layered structure is described below. FIG. 2 is a schematic cross-sectional view taken along the line I-I' of FIG. 1(A). In the example of FIG. 2, the layered structure, in which an undoped InAlAs spacer layer 150, an InAlAs donor layer 15 which is an electron supplying layer, and an undoped InAlAs Schottky junction layer 152 are successively laid on the active channel layer 14. Here, the spacer layer 150 is a layer for isolating the donor layer 15 from the active channel layer 14, while the Schottky junction layer 152 is a layer for forming Schottky junction with the control electrode 26.

With the above-described layered structure, more satisfactory Schottky junction between the control electrode 26 and the donor layer 15 can be made. An n+-InGaAs capping layer 16 is provided on a single layer of the InAlAs donor layer 15 or on the above-described layered structure. More specifically, the semiconductor device 10 of this example is HEMT having a heterostructure of InGaAs active channel layer 14 and InALAs donor layer 15.

The layered structure 20 is a main element of the semiconductor device 10, which is formed as a mesa structure portion 18 (also simply referred to as "mesa structure" or "mesa structure section"). This mesa structure 18 includes a part of the InAlAs buffer layer 13, the active channel layer 14, the donor layer 15, and n+-InGaAs capping layer 16. By forming the main element of the semiconductor device 10 as a mesa structure, adjacent semiconductor devices on the substrate 12 can be isolated from each other.

In this example, the mesa structure 18 has a quadrangular pyramid shape as a whole, and the outline of the mesa structure on its top view forms rectangular shape. The n+-InGaAs capping layer 16 is formed as the most upper layer of the layered structure 20. This capping layer 16 is a contact layer to connect with ohmic metals. A first metal main electrode 22a and a second metal main electrode 22b, which are ohmic metals, are respectively provided on the upper surface 16x of the capping layer 16. As well known, one of the first and the second metal main electrodes is used as a source electrode, and the other is used as a drain electrode.

The first and the second metal main electrodes 22a and 22b are disposed away from each other on the upper surface 16x. The facing sides 23a and 23b of the first and the second metal main electrodes 22a and 22b are parallel to each other. Edges are formed at the boundaries between the upper surface 16x and the side surface 18a of the mesa structure 18. The edges include a pair of edges 18b and 18b which are parallel to the facing sides 23a and 23b of the first and the second metal main electrodes 22a and 22b, and also include a pair of edges 18c and 18c, which perpendicularly cross the edges 18b and 18b. The above-described first and second metal main electrodes 22a and 22b are respectively provided so as to cover the upper surface 16x and the side surfaces 18a of the mesa structure 18 including the edges 18b.

The first and the second metal main electrodes 22a and 22b are prepared from any suitable material, which can make an ohmic contact with the capping layer, which is the most upper layer of the layered structure. The material for the metal main electrodes is preferably titanium (Ti), platinum (Pt), gold (Au), or gold-germanium (Au—Ge based) alloy. On the exposed regions of the mesa structure 18, which are exposed between the first and the second metal main electrodes 22a and 22b, a first and a second semiinsulating ion implantation regions 40ab and 40bb are provided as "islands (i.e. isolated regions)", being away from each other. In the description below, both ion implantation regions may be simply denoted by the reference numeral 40.

The first and the second ion implantation regions 40ab and 40bb are provided in a direction vertical to the substrate surface 12a from the exposed surface of the mesa structure 18 to the depth level below the active channel layer (i.e. electron transit layer). In addition, at the height level of the upper surface 16x of the mesa structure 18, the ion implantation regions 40 are formed in regions surrounded by the facing edges 18c and 18c, and the facing sides 23a and 23b of the first and the second metal main electrodes 22a and 22b, being parallel to the substrate surface. These regions are formed from the edges 18c, 18c to the range not to degrade the performance of the semiconductor device 10. In this example, as also understandable from the top view of FIG. 1(A), the outline of the first and the second ion implantation regions 40ab and 40bb forms a rectangular shape when the mesa structure 18 is viewed from its top side.

Here, "the range not to degrade the performance of the semiconductor device" can be determined as a distance that can fully maintain the performance and characteristics required for the semiconductor device to be manufactured. It is preferably between 0.5 μm and 1 μm inside of the mesa structure 18 from the edges 18c. In the example illustrated in the figure, the first and the second ion implantation regions 40ab and 40bb are provided along the direction of the edges 18c, i.e. the channel length direction, so as to fill the whole space between the first and the second metal main electrodes 22a and 22b. However, the purpose to form the ion implantation regions 40 is to electrically isolate and keep away the active channel layer 14 from a metal control electrode 26 which will be described below. Therefore, the first and the second ion implantation regions 40ab and 40bb can be formed only in regions right under the metal control electrode 26, having similar width to that of the outline of the metal control electrode.

An interlayer spacer film 30 is provided on and covers the layered structure 20 of compound semiconductor and the first and the second metal main electrodes 22a and 22b. This interlayer spacer film 30 is preferably formed from a silicon oxide film, silicon nitride film, or the like, such as SiON and SiN. A slit opening 30a is formed on the interlayer spacer film 30 between the first and the second metal main electrodes 22a and 22b along the direction perpendicular to the direction connecting between the main electrodes, i.e. along the direction of the facing sides 23a and 23b, and penetrates the interlayer spacer film 30 in the thickness direction. The n+-InGaAs capping layer 16, which lies directly under the opening 30a, has a recess 17, which connects to the opening 30a and has a shape corresponding to the shape of the opening 30a. In the constitution illustrated in FIG. 2, the upper surface of the InAlAs donor layer 15 is exposed from the recess 17. On the other hand, in the constitution illustrated in FIG. 2, the upper surface of the undoped InAlAs Schottky junction layer 152 is exposed from the recess 17.

The width of the recess 17 in the channel length direction, which is perpendicular to the longitudinal direction of the recess is set larger than that of the opening 30a. The length of the recess in its longitudinal direction is set larger than that of the outline of the lower end of the opening 30a so that the InAlAs donor layer 15 or undoped InAlAs Schottky junction layer 152, which is exposed from the opening 30a, can be more exposed. The edges of the recess, which respectively extend parallel to the facing sides 23a and 23b of the first and the second metal main electrodes 22a and 22b, are arranged along the channel width direction in the first and the second ion implantation regions 40ab and 40bb, respectively (See FIG. 1(C) for schematic illustration of the arrangement).

A metal control electrode 26 which penetrates the interlayer spacer film 30 is provided on the upper surface of the above-described InAlAs donor layer 15. This metal control electrode 26 is provided so as to penetrate the recess 17 and the opening 30a, i.e. penetrate n+-InGaAs capping layer without contact, and be upright on the upper surface of the donor layer. In addition, in the example of the constitution illustrated in FIG. 1, the metal control electrode 26 has a width which is long enough to fill the opening 30a in the width direction, but smaller than the width and length of the recess 17. The top section of the metal control electrode 26 is provided on the interlayer film 30 being wider than the width of the opening 30a.

On the other hand, in the constitution of FIG. 2, the top section of the metal control electrode 26 is formed in level with the upper surface of the interlayer spacer film 30. This metal control electrode 26 is arranged so as to perpendicularly cross the edges 18c of the mesa structure 18, which are exposed from the first and the second metal main electrodes 22a and 22b. In other words, the metal control electrode 26 extends outside of the mesa structure 18, crossing over the two facing edges 18c and 18c. The metal control electrode 26 is formed from any suitable material selected according to the specification of the semiconductor device to be manufactured. Preferably, it is formed from a metal selected from titanium (Ti), platinum (Pt), gold (Au), aluminum (Al) and the like, or alloy of those metals.

As described above, the semiconductor device 10 of this invention has the first and the second ion implantation regions for isolating and keeping away the active channel layer 14 from the metal control electrode 26 as "islands". Therefore, the active channel layer 14 and the metal control electrode 26 will not directly contact with each other, so that increase of gate leakage current can be effectively prevented. For this reason, the reliability of the operation of the semiconductor device can be improved.

1-1-2. Method of Manufacturing the Semiconductor Device

Referring now to FIGS. 3-9, a method of manufacturing the semiconductor device 10, which is described above referring to FIGS. 1(A)-1(C) and 2, will be described below. FIG. 3(A) is a schematic top view illustrating the process of manufacturing the semiconductor device of the first embodiment. FIG. 3(B) is a schematic cross-sectional view of the semiconductor in the middle of a manufacturing process, which is taken along the line II-II' of FIG. 3(A). FIG. 4(A) is a schematic top view of the semiconductor device in the manufacturing process after the one of FIG. 3(A). FIG. 4(B) is a schematic cross-sectional view of FIG. 4(B) taken along the line II-II' of FIG. 4(A).

Figure 4A:
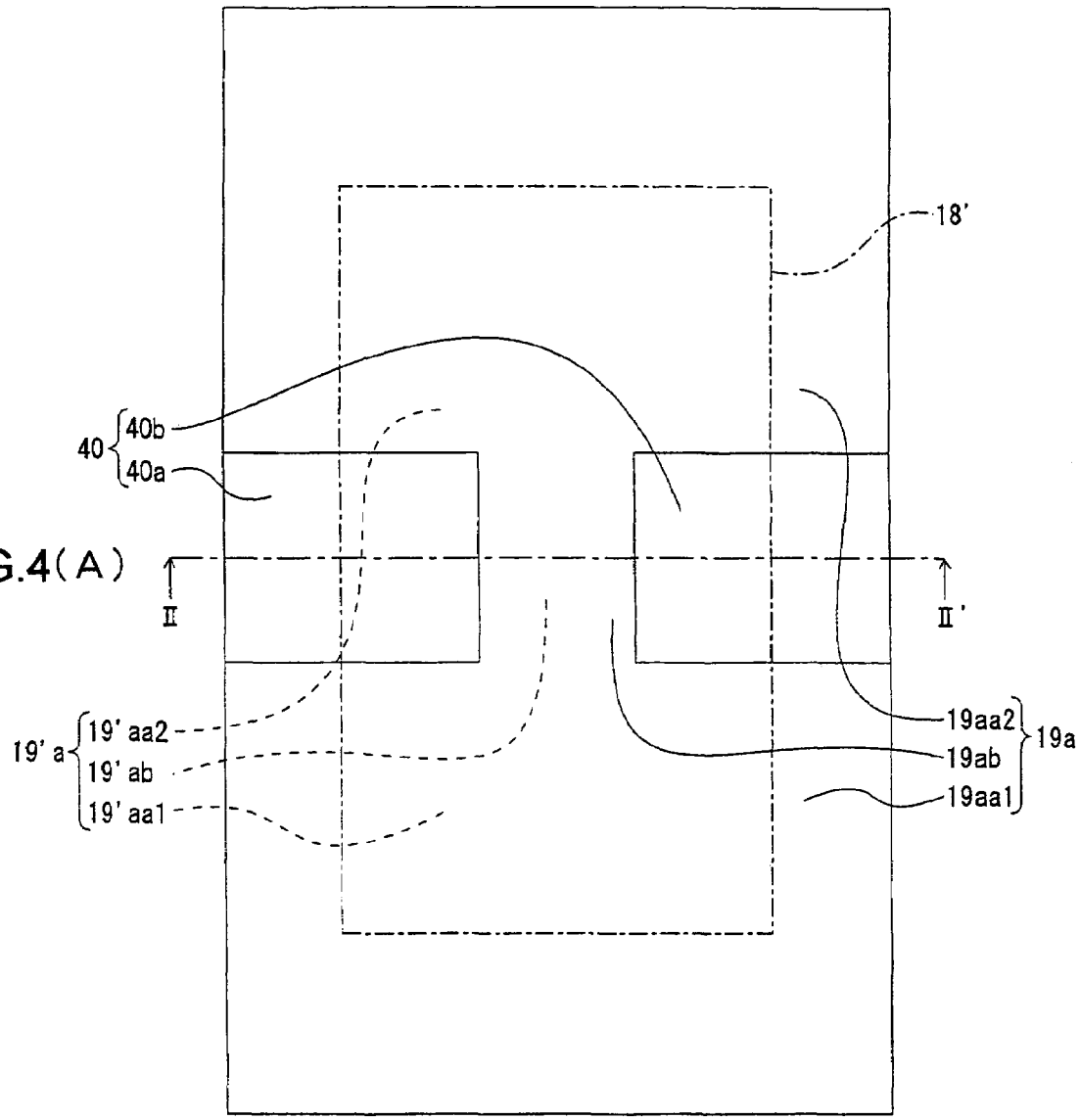
FIG. 4(A) is a schematic top view of the semiconductor device in the process after the one of FIG. 3(A).
Figure 5A:
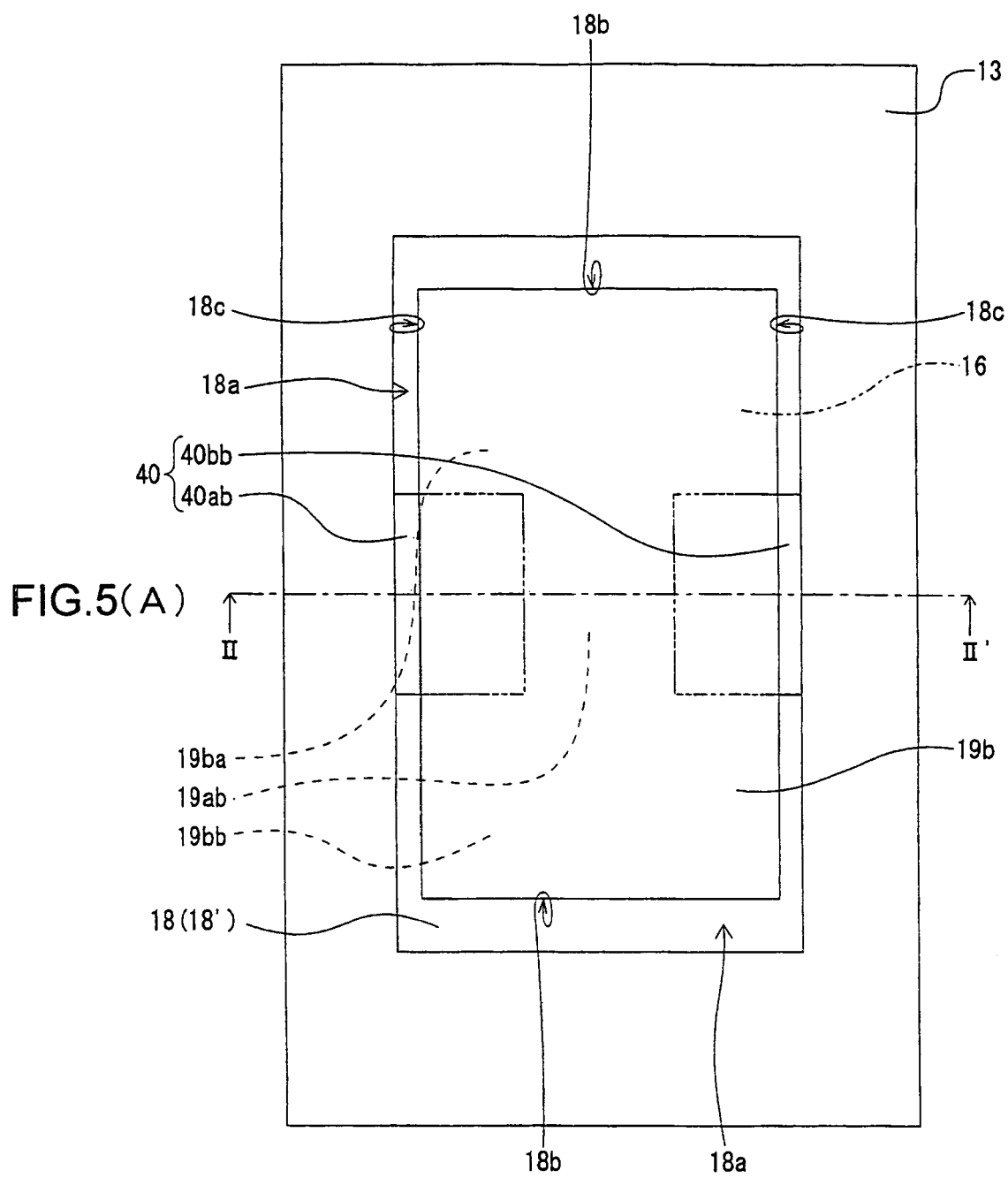
FIG. 5(A) is a schematic top view of the semiconductor device in the process after the one of FIG. 4(A).
Figure 5B:
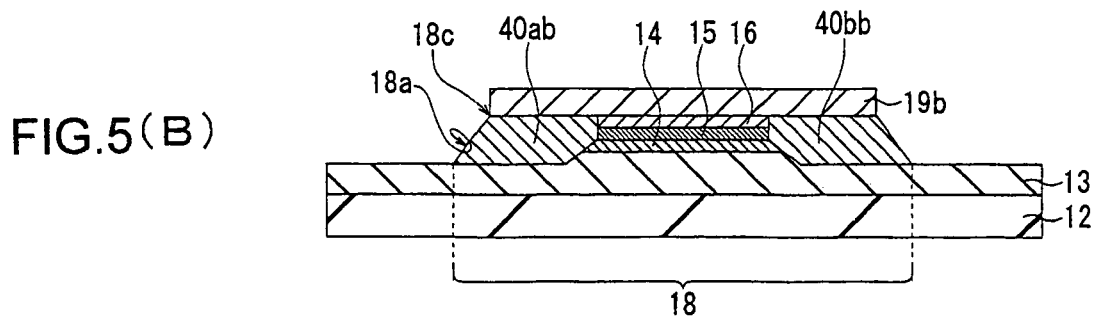
FIG. 5(B) is a schematic cross-sectional view taken along the line II-II' of FIG. 5(A).
Figure 6A:
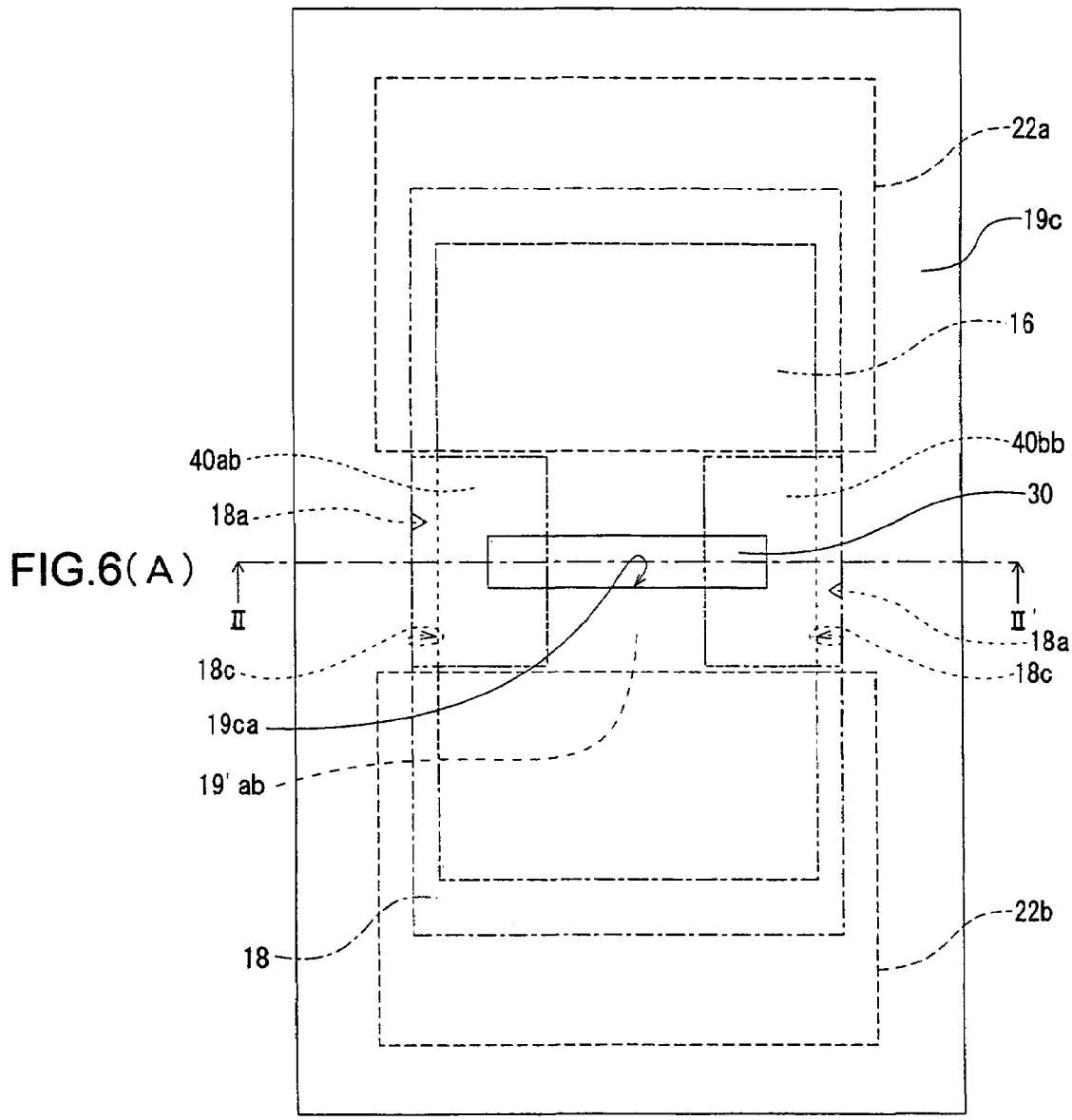
FIG. 6(A) is a schematic top view of the semiconductor device in the process after the one of FIG. 5(A).
Figure 7A:
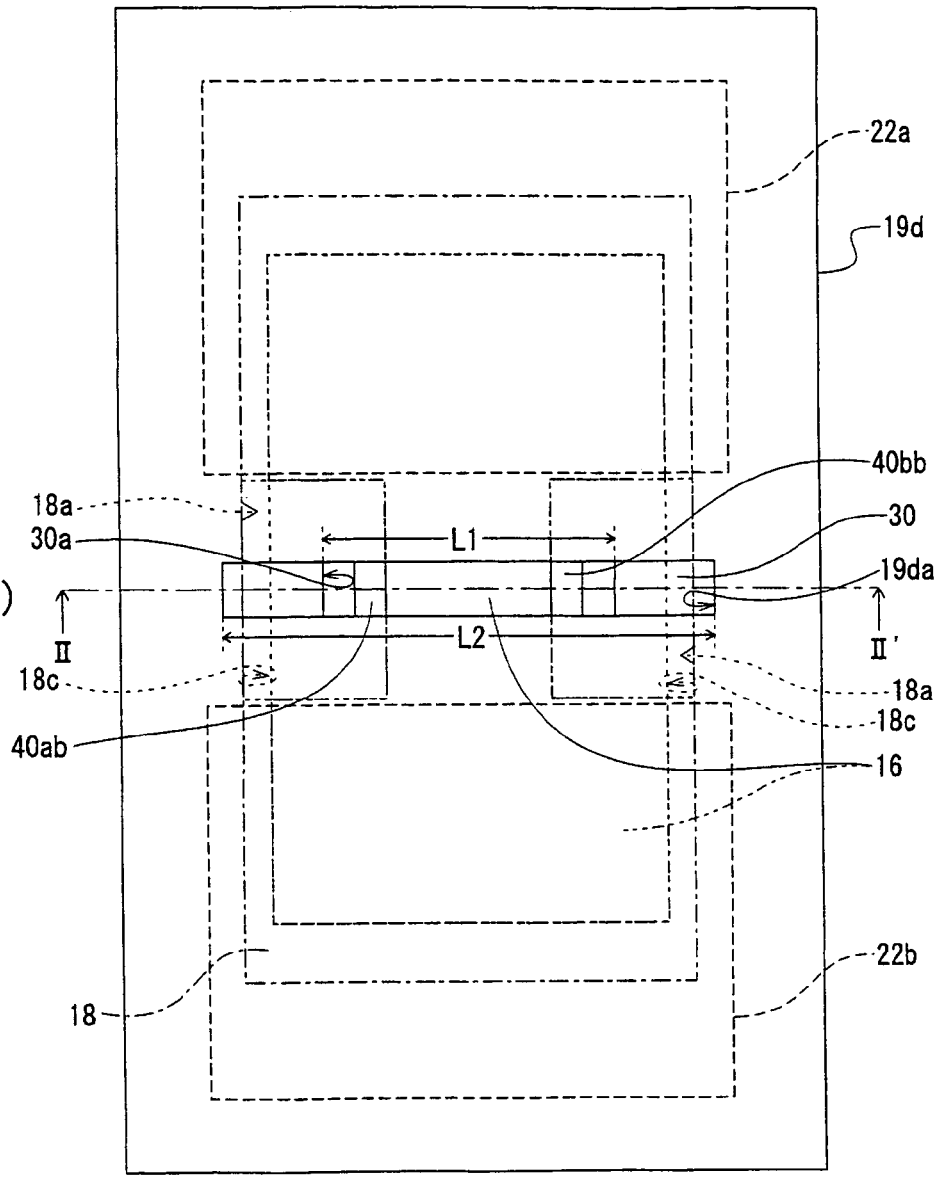
FIG. 7(A) is a schematic top view of the semiconductor device in the process after the one of FIG. 6(A).
Figure 7B:
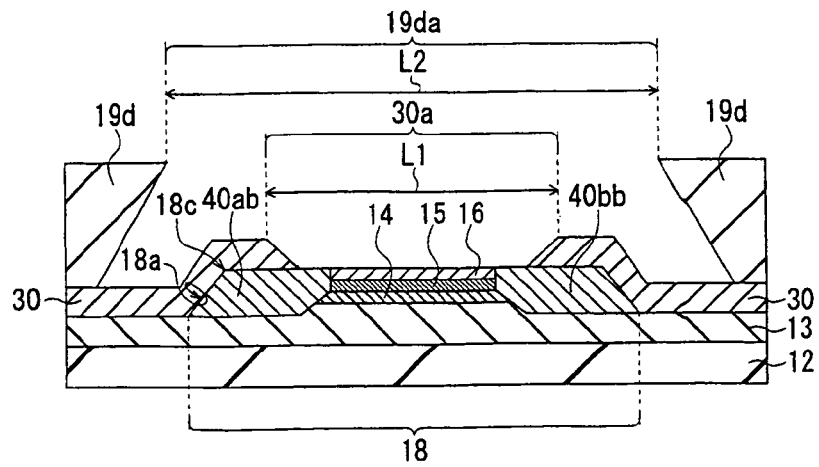
FIG. 7(B) is a schematic cross-sectional view taken along the line II-II' of FIG. 7(A).
Figure 9A:
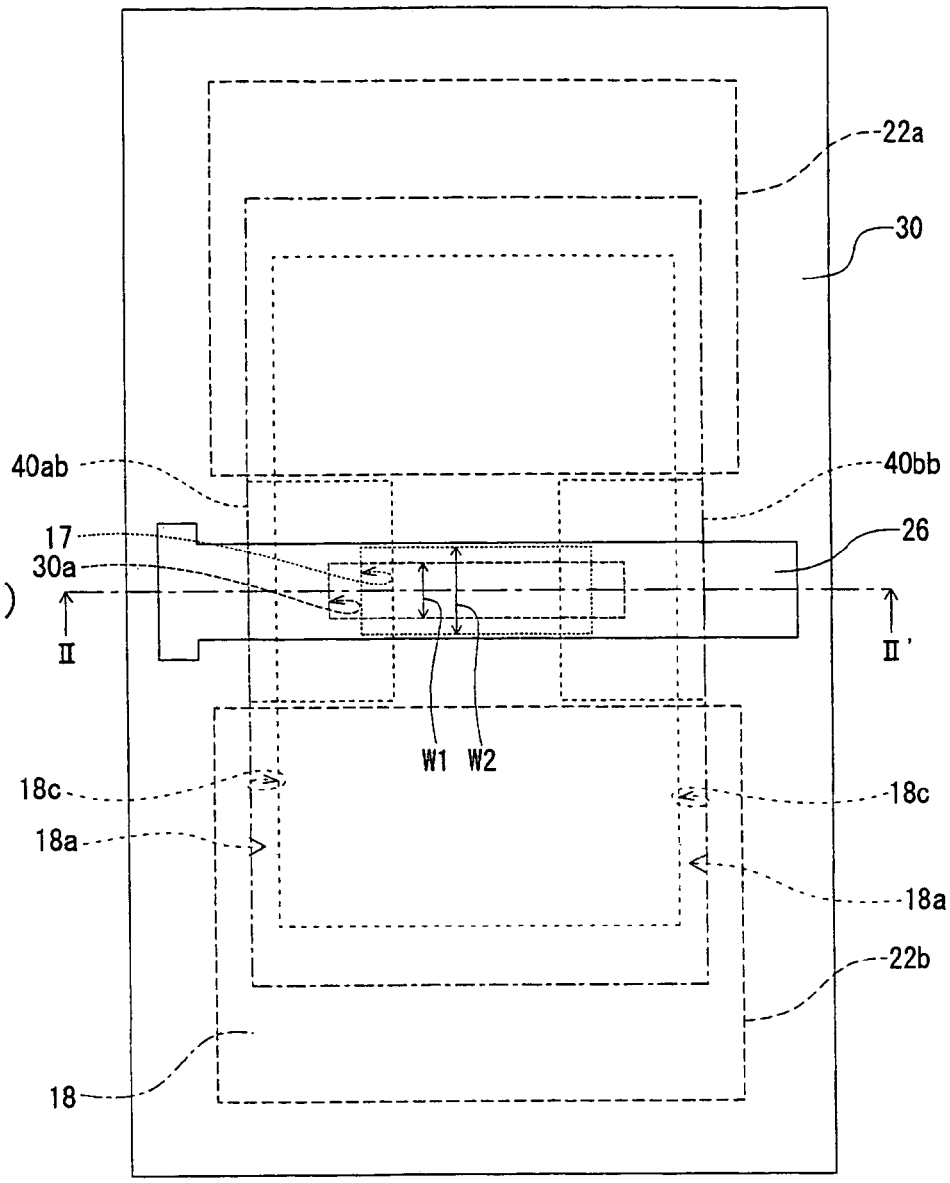
FIG. 9(A) is a schematic top view of the semiconductor device in the process after the one of FIG. 8(A).
Figure 9B:
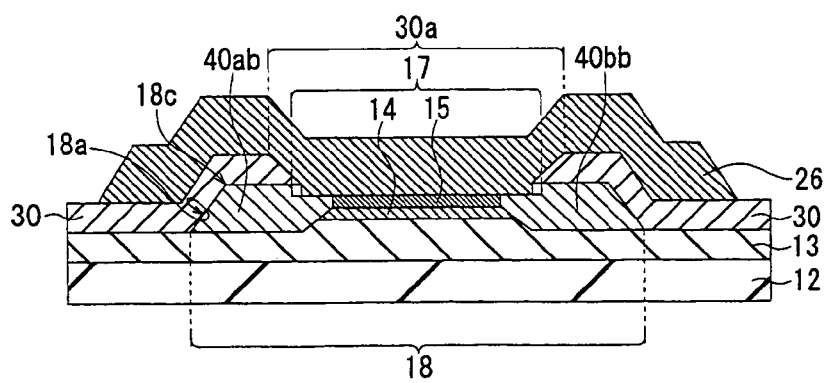
FIG. 9(B) is a schematic cross-sectional view taken along the line II-II' of FIG. 9(A).

FIG. 5(A) is a schematic top view of the semiconductor device in the process after the one of FIG. 4(A). FIG. 5(B) is a schematic cross-sectional view taken along the line II-II' of FIG. 5(A). FIG. 6(A) is a schematic top view of the semiconductor device in the process after the one of FIG. 5(A). FIG. 5(B) is a schematic cross-sectional view taken along the line II-II' of FIG. 6(A). FIG. 7(A) is a schematic top view of the semiconductor device in the process after the one of FIG. 6(A). FIG. 7(B) is a schematic cross-sectional view taken along the line II-II' of FIG. 7(A). FIG. 8(A) is a schematic top view of the semiconductor device in the process after the one of FIG. 7(A). FIG. 8(B) is a schematic cross-sectional view taken along the line II-II' of FIG. 8(A). FIG. 9(A) is a schematic top view of the semiconductor device in the process after the one of FIG. 8(A). FIG. 9(B) is a schematic cross-sectional view taken along the line II-II' of FIG. 9(A).

Figure 3A:
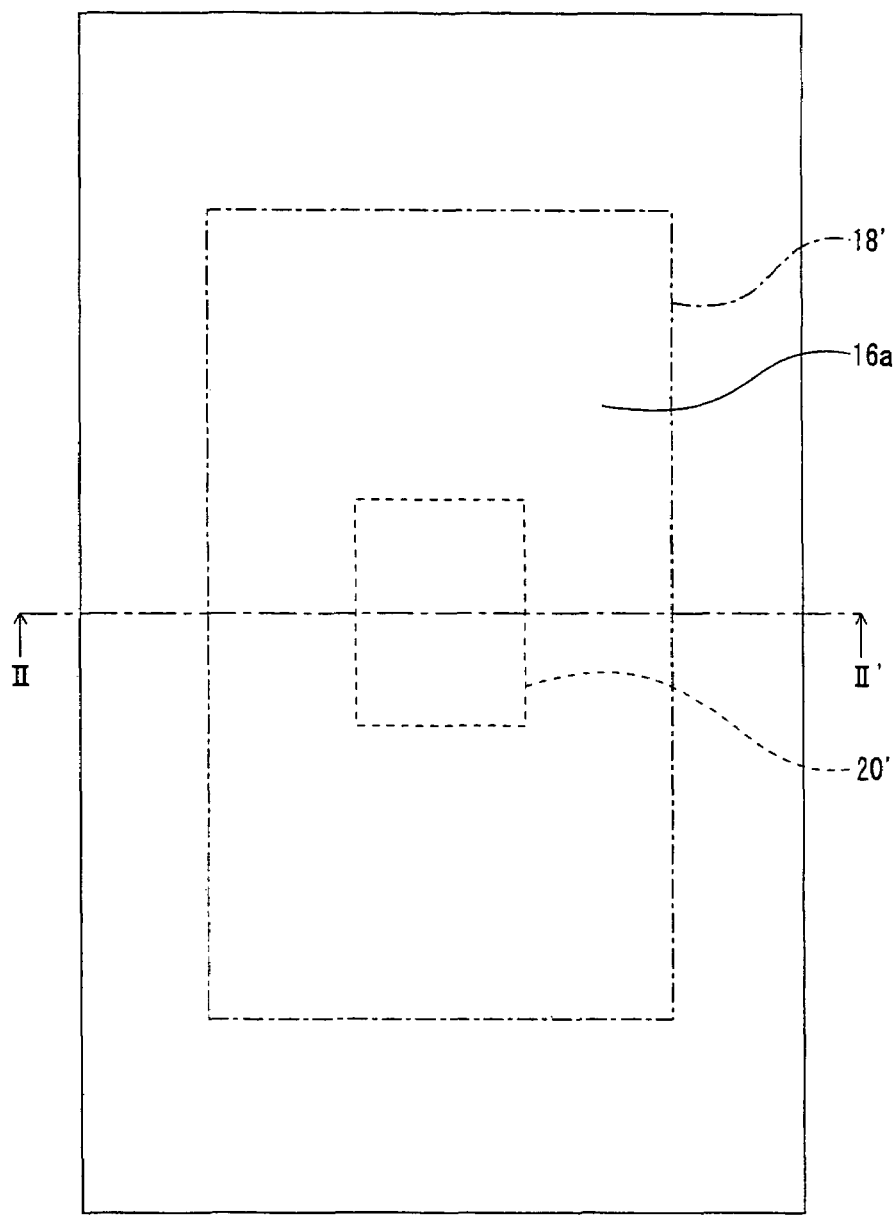
FIG. 3(A) is a schematic top view illustrating the process of manufacturing the semiconductor device of the first embodiment.
Figure 3B:
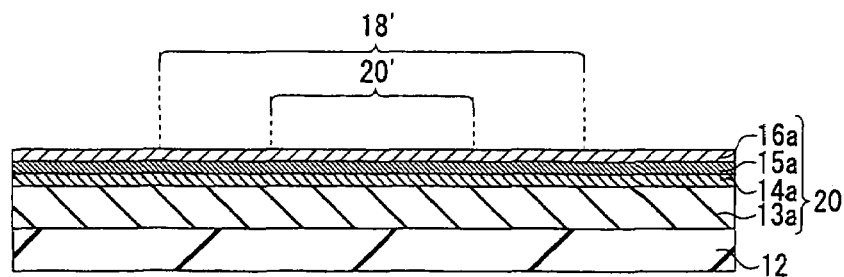
FIG. 3(B) is a schematic cross-sectional view of the semiconductor device in the middle of the manufacturing process, which is taken along the line II-II' of FIG. 3(A).

As shown in FIG. 3(B), the layered structure 20 of compound semiconductor, which contains the active channel layer 14, is first formed on the semiinsulating substrate 12. This layered structure 20 is formed by successively epitaxially growing a plurality of compound semiconductor layers. In this example, InAlAs preliminary buffer layer 13a is formed on the InP substrate 12, which is a semiinsulating substrate. Formation of this buffer layer is done by performing an epitaxial growth process under publicly known suitable conditions. Similarly, a preliminary active channel layer 14a, i.e. InGaAs preliminary active channel layer 14a, is formed on the InAlAs preliminary buffer layer 13a.

Then, in case of constitution of FIG. 1, a preliminary donor layer 15a, i.e. InGaAs preliminary donor layer 15a, is formed on the InGaAs preliminary active channel layer 14a. In case of the constitution of FIG. 2, a layered structure is formed by successively forming the spacer layer 150, the donor layer 15 and the Schottky junction layer 152. Since the formation of the layered structure of FIG. 2 is similar to that of the donor layer, the explanation is omitted unless specifically noted. Then, n+-InGaAs preliminary capping layer 16a is formed on the InGaAs preliminary donor layer 15a.

As described above, the layered structure 20 of compound semiconductor, in which epitaxial layers are successively laid, is formed. Depending on the specification of the device to be manufactured, in the epitaxial growth process of each layer of the layered structure 20, an epitaxial layer can be formed taking consideration of lattice match.

Figure 4B:
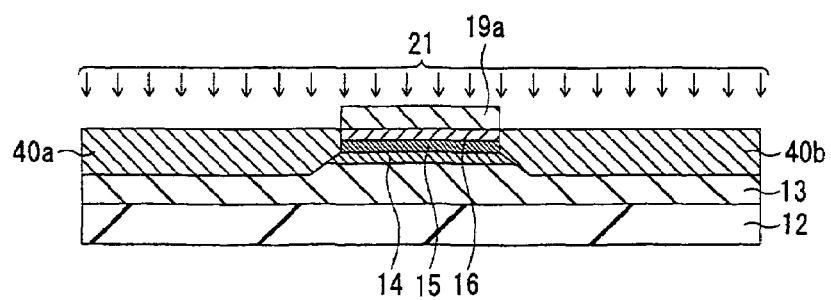
FIG. 4(B) is a schematic cross-sectional view of FIG. 4(B) taken along the line II-II' of FIG. 4(A).

As shown in FIGS. 3(A) and 3(B), an inner region, i.e. active layer forming region 20', is set in the layered structure 20 in advance. Here, the active layer forming region 20' means a partial region of the layered structure 20, where the active channel layer 14 remains when the ion implantation region or air-gap is formed in the process that will be described below. Then, as shown in FIGS. 4(A) and 4(B), an active layer forming resist layer (resist pattern) 19a to cover the active layer forming region 20' that is set as described above is formed. The shape of the resist pattern 19a on its top view is, for example, a shape having a rectangular narrow section 19ab and rectangular expanded sections 19aa1 and 19aa2 on the sides of the narrow section.

As for a resist material of the active layer forming resist layer 19a, any conventionally known suitable material can be used. The active layer forming resist layer 19a is preferably formed from a novolak resin based resist material by conventional method as a layer 19a having at least 2 μm of thickness. Then, an ion implantation of ions 21 into the layered structure 20 is performed by an ion implantation process using conventionally known ion implantation device using the active layer forming resist patter 19a as a mask. This ion implantation is performed such that the ion implantation layer 40 is formed from the upper surface of the preliminary capping layer 16a to the depth level below the preliminary active channel layer 14a.

In this example, the ion implantation layer 40 is formed from the upper surface of the preliminary capping layer 16a, i.e. the upper surface of the layered structure 20, up to the middle depth level of the InAlAs preliminary buffer layer 13a. The region where the ion implantation is not performed is a region that remains as the buffer region 13, the active channel layer 14, the donor layer 15 and the capping layer 16. In the figure, this regions is denoted by the reference numeral 19'a. The non-ion implantation region 19'a has the first and the second expanded sections 19aa1 and 19aa2, which correspond to the lower sides of the expanded sections 19aa1 and 19aa2 of the mask pattern 19a, and a narrow section 19'ab, which connects between those first and second expanded sections, and corresponds to the lower side of the narrow section 19ab of the mask pattern 19a.

By the ion implantation process, the region not covered by the mask pattern 19a becomes the ion implantation layer 40. On the other hand, the region covered by the mask pattern 19a becomes the non-ion implantation region 19'a. The ion implantation layers 40 are formed as the first and the second ion implantation layers 40a and 40b on the sides of narrow non-ion implantation region 19'ab, which remains and is formed on the lower side of the narrow section 19ab of the masking (resist) pattern 19a, across the non-ion implantation region 19'ab.

Those first and second ion implantation layers 40a and 40b are layer regions where the characteristics of each layer that constitutes the layered structure 20 are changed to be semi-insulating. In addition, in this example of constitution, the facing sides of the first and the second ion implantation layers 40a and 40b are parallel to each other. The ions to form the ion implantation layers 40, i.e. semiinsulating regions, are preferably selected from boron (B) ions or oxygen (O) ions. As for the implantation condition, for example, the implantation energy is preferably set between 10 KeV and 30 KeV, and the ion dose is preferably set $1.0 \times 10^{14}$ ions/cm$^2$.

Then, the active layer forming resist pattern 19a is removed. According to the above-described process, the semiinsulating ion implantation layers 40 (40a and 40b) are formed on the layered structure 20.

First, as shown in FIG. 4(A), in order to form a mesa structure forming resist layer (resist pattern) 19b on the layered structure 20 containing the ion implantation region 40, a rectangular region 18' is set on the surface of the layered structure 20. Here, the rectangular region 18' includes the narrow section 19'ab of the non-ion implantation 19'a, the first and the second expanded sections 19'aa1 and 19'aa2 provided on the sides of the narrow section 19'ab, and a part of the first and the second ion implantation layers 40a and 40b.

Then, as shown in FIGS. 5(A) and 5(B), the mesa structure forming resist layer (resist pattern) 19b is formed on the layered structure 20 containing the ion implantation region 40. In this example of the constitution, the resist pattern 19b is a mask to cover the region that forms the mesa structure 18 for device isolation, and is provided on the above-described rectangular region 18' being symmetrical about the capping layer 16 when it is viewed from the top side.

Then, using the resist pattern 19b as a mask, the layered structure 20 containing the ion implantation layer 40, which is exposed from the resist pattern 19b, is etched (hereinafter, this etching is also referred to as "mesa etching"). This etching is performed on the circumferential area of the rectangular region 18' from the surface of the layered structure 20 to the ion implantation region 40a and 40b and a region where the ion implantation is not performed. For example, mesa etching can be performed until the semiinsulating substrate is exposed, or up to the middle depth level of the layer 13 as shown in the figure. For example, this mesa etching process can be performed at normal temperature (25° C.) with $H_3PO_4$-based etchant according to ordinary method.

Then, by removing the mesa structure forming resist pattern 19b, the mesa structure 18 having tilted side surfaces 18a is obtained. The mesa structure 18 includes the first and the second mesa expanded sections 19ba and 19bb, and the first and the second mesa ion implantation regions 40ab and 40bb. The first and the second mesa expanded sections 19ba and 19bb are the regions obtained from the first and the second expanded sections 19aa1 and 19aa2 (see FIG. 4(A)), while the first and the second mesa ion implantation regions 40ab and 40bb are obtained from the first and the second ion implantation regions 40a and 40b. The outline of the mesa structure section 18 on its top view is defined by the edge sections 18b and 18b and 18c and 18c. As described above, the etching process is performed onto the ion implantation layer 40, and the first and the second mesa ion implantation regions 40ab and 40bb, which are away from each other in the channel width direction across the capping layer 16, are obtained.

As shown in FIG. 6(A), the first and the second metal main electrodes 22a and 22b, which are away from each other, are formed on the mesa structure formed as described above (See FIGS. 1(B) and 2). The first and the second metal main electrodes are formed such that they are away from each other across the mesa structure, being symmetrical about the center of the mesa structure 18. At this time, with the first and the second metal main electrodes 22a and 22b, a part of the facing edges 18c and 18c and the side surfaces 18a, which are adjacent to the edges 18c, are exposed. The first and the second metal main electrodes 22a and 22b can be formed from the above-described materials by performing well-known masking process, metal deposition process, and lift-off process under any suitable conditions.

Figure 6B:
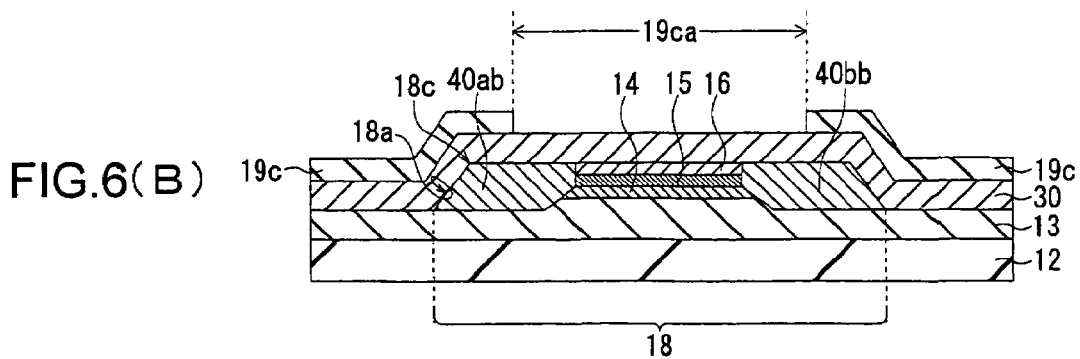
FIG. 6(B) is a schematic cross-sectional view taken along the line II-II' of FIG. 6(A).

Then, as shown in FIGS. 6(A) and 6(B), an interlayer spacer film 30 as an interlayer insulating film is formed over the whole upper surface of the buffer layer 13 including the upper surfaces of the mesa structure 18 and the first and the second metal main electrodes 22a and 22b. The interlayer spacer film 30 can be formed by depositing above-described material under any suitable conditions according to suitable method, e.g. plasma CVD method. Thereafter, as shown in FIGS. 6(A) and 6(B), an opening forming resist layer (resist pattern) 19c having an opening 19ca is formed on the interlayer spacer film 30.

Then, using the opening forming resist pattern 19c as a mask, a part of the interlayer spacer film 30 is removed by etching, and a slit opening 30a that exposes the n+-InGaAs capping layer is formed as a first opening. Since this opening 30a is an opening for forming the metal control electrode, it is formed according to the dimension of the metal control electrode in the length and the width direction. The opening forming resist pattern 19c has an opening which is formed along the edges 18c and 18c (side surface 18a). Therefore, the opening 30a formed by the resist pattern 19c is formed between the first and the second metal main electrodes being along the direction vertical to the direction connecting between the main electrodes.

Furthermore, with the opening 30a, a part of the surfaces of the non-ion implantation region of the narrow section 19'ab and of the first and the second mesa ion implantation regions are continuously exposed. The opening 30a is formed by patterning the interlayer spacer film 30 by performing a reactive ion etching (RIE) process under any suitable conditions using a mask pattern 19c, which is patterned by well-known EB lithography process. For example, this reactive ion etching process is preferably performed using $SF_6$ gas at a pressure of 3.5 Pa with 100W of electrical power. After forming the opening 30a, the resist pattern 19c is removed.

As shown in FIGS. 7(A) and 7(A), the width L1 of the opening 30a in the channel width direction is larger than the width of the donor 15 in the channel width direction. Then, a metal control electrode forming resist layer (resist pattern) 19d is formed. The metal control electrode forming resist pattern 19d should have a shape having an opening which corresponds to the shape of the metal control electrode 26 to be formed. More specifically, the metal control forming resist pattern 19d is formed on the interlayer spacer film 30 as a resist pattern having a rectangular opening 19da. The opening 19da of the resist pattern 19d extends in the channel width direction, i.e. the direction perpendicular to the facing edges 18c of the mesa structure, which are exposed from the first and the second metal main electrodes 22a and 22b, and has the opening width L2 larger than L1.

As shown in FIGS. 8(A) and 8(B), the both ends of the opening 19da are located outside the edges 18c of the mesa structure 18. On the other hand, the width w1 of the opening 19da in the channel length direction is set generally same as that of the metal control electrode. Then, while the metal control electrode forming resist pattern remains, only n+-InGaAs capping layer exposed from the opening 30a is selectively etched (hereinafter, this process is also referred to as "recess etching (process)"). This recess etching is performed on a part of the non-ion implantation region of the narrow section 19'ab and of the first and the second mesa ion implantation regions 40a and 40b to the depth level below the capping layer 16 but above the active channel layer 14. More specifically, for example, it is preferred that this recess etching is performed using well-known citric acid-based etchant at normal temperature (25° C.) by selectively performing isotropic etching. At this time, while the capping layer 16 is etched, the regions surrounding the capping layer, i.e. the first and the mesa ion implantation regions 40ab and 40bb, are also etched and removed. Therefore, the interlayer spacer layer 30 exposed from the metal control electrode forming resist pattern 19d is not etched in this process. As a result, there is no concern of exposing the active channel layer 14 to the etchant in this etching process.

In addition, as shown in FIG. 8(B), the recess 17 is formed such that the ends of the recess 17 in the extending direction, which corresponds to the longitudinal direction of the metal control electrode, are arranged in the first and the second mesa ion implantation regions 40ab and 40bb. By this recess etching, a wide recess 17, which has larger width w2 in the direction connecting between the electrodes than the width w1 of the opening and connects to the opening 30a, is formed under the opening 30a.

Then, as shown in FIGS. 9(A) and 9(B), using the above-described metal control electrode forming resist pattern 19d as a mask, the metal control electrode 26 is formed by performing a metal deposition process under any suitable conditions. The metal deposited film is formed on the donor film 15, filling the opening 30a and a part of the recess 17 which connects to the opening 30a, and is continuously formed on the interlayer spacer film 30 in other words, the metal control electrode 26 is provided upright on the bottom surface of the recess, penetrating the opening 30a. Simultaneously the ends of the control electrode in the extending direction of the opening 30a are formed contacting with the exposed surface of the first and the second mesa ion implantation region. The width of the control electrode 26 is formed to have same width as the width w1 of the opening 30a.

Thereafter, the resist pattern 19d is removed by well-known lift-off process. By this lift-off process, the remaining metal deposited film becomes the metal control electrode 26. The metal control electrode 26 extends being perpendicular to the edges 18c of the mesa structure 18, which are exposed between the first and the second metal main electrodes 22a and 22b. More specifically, the metal control electrode 26 is formed so as to extend on the interlayer spacer film 30 to the outside of the mesa structure 18, crossing over the two facing edges 18c and 18c.

If the semiconductor device 10 is formed as described above, especially in the recess etching process, the active channel layer is covered with the interlayer insulating film. As a result, the active channel layer is protected from the etchant. Accordingly, in the process of forming the metal control electrode 26, the reduction or loss of the performance of the active channel layer 14 due to contamination of the active channel layer 14 by the etchant can be prevented.

Example of Modification of the First Embodiment 1-2-1. Constitution of the Semiconductor Device Referring now to FIG. 10, the constitution of an example of a modification of the semiconductor device of the first embodiment will be described below. Here, elements similar to those already described in the first embodiment are denoted by the same reference numerals and the explanation is omitted. Since materials and conditions of the manufacturing process are almost similar to those in the first embodiment, detailed explanation is omitted.

Figure 10A:
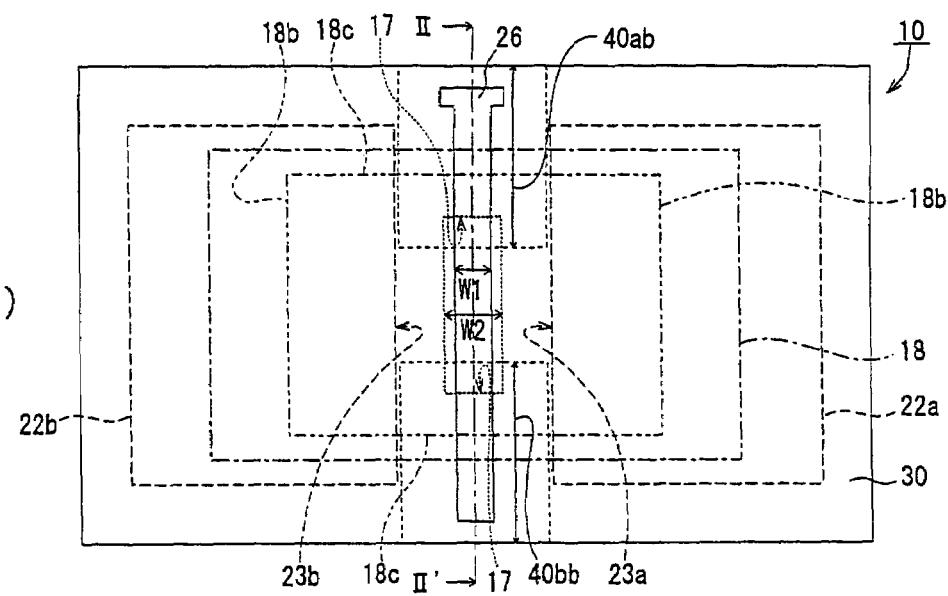
FIG. 10(A) is a schematic top view of the semiconductor device, which is an example of modification of the first embodiment, illustrating the arrangement of each element.
Figure 10B:
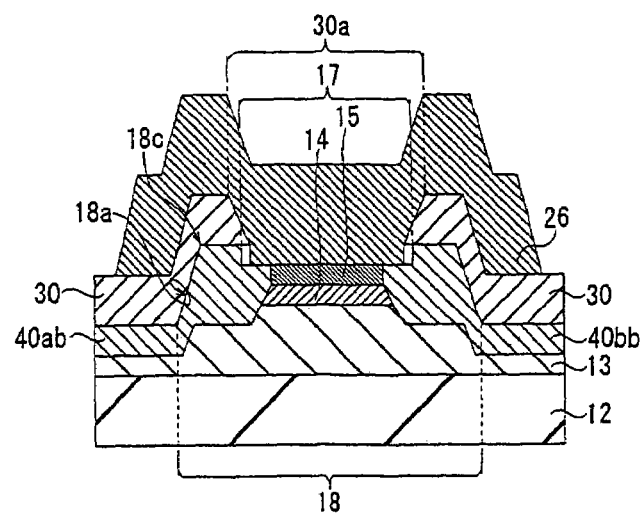
FIG. 10(B) is a schematic cross-sectional view taken along the line II-II' of FIG. 10(A).

FIG. 10(A) is a schematic top view of the semiconductor device, which is an example of modification of the first embodiment, illustrating the arrangement of each element. FIG. 10(B) is a schematic cross-sectional view taken along the line II-II' of FIG. 10(A). The semiconductor device 10 in this example of modification differs from the semiconductor device 10 of the first embodiment, which is described referring to FIGS. 1(A), 1(B) and 2, only in the range where the first and the second mesa ion implantation regions 40ab and 40bb, i.e. the isolated semiinsulating regions, are formed, and substantially similar to the first embodiment in other features of the constitution. Therefore, in the description below, only the difference from the first embodiment will be described.

In the semiconductor device 10 in this example, the first and the second semiinsulating mesa ion implantation layers 40ab and 40bb extend even outside of the region where the mesa structure 18 is formed (See FIGS. 5(A) and 5(B)), i.e. outside of the edges 18c, being continued from the region which is formed inside the edge 18c of the mesa structure 18 exposed from the first and the second metal main electrodes 22a and 22b (See FIGS. 1(A) and 1(B)). Here, even in this case, as shown with a dashed line in FIG. 5(A), the outline of the first and the second ion implantation regions 40ab and 40bb forms a rectangular shape on its top view. In this example of modification, the first and the second mesa ion implantation regions 40ab and 40bb are referred to as expanded ion implantation regions.

An interlayer spacer film 30 is provided on the layered structure 20 of compound semiconductor where the expanded first and second mesa ion implantation regions 40ab and 40bb are provided, and on the first and the second metal main electrodes 22a and 22b. The interlayer spacer film 30 itself is formed similarly to the one in the semiconductor device of the first embodiment.

As described above, in this constitution, the first and the second mesa ion implantation regions 40ab and 40bb, which isolate the active channel layer 14 and the metal control electrode 26 from each other, extend in the outer regions of the mesa structure 18. With this constitution, the active channel layer 14 and the metal control electrode 26 are even more securely isolated from each other, so that increase of gate leakage current can be effectively prevented. Therefore, similarly to the semiconductor device 10 of the first embodiment, the reliability in operating the device can be further improved.

1-2-2. Method of Manufacturing the Semiconductor Device

Referring now to FIGS. 11-16, a method of manufacturing the semiconductor device described referring to FIGS. 10(A) and 10(B), which is an example of modification of the first embodiment, will be described below. FIG. 11(A) is a schematic top view illustrating the process of manufacturing the semiconductor device, which is an example of modification of the first embodiment. FIG. 11(B) is a schematic cross-sectional view of the semiconductor device in the middle of the manufacturing process, which is taken along the line II-II' of FIG. 11(A).

Figure 11A:
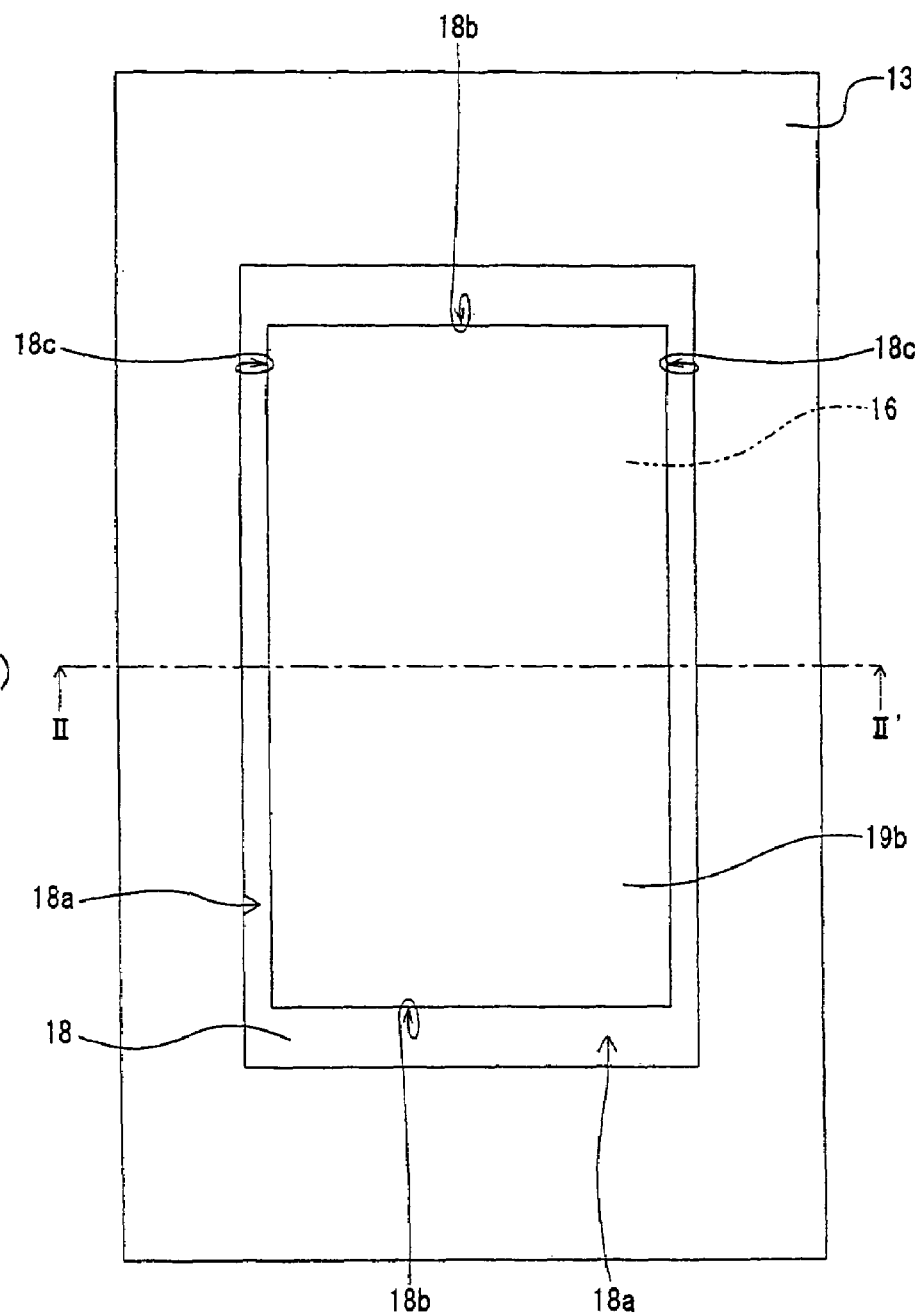
FIG. 11(A) is a schematic top view illustrating the process of manufacturing the semiconductor device, which is an example of modification of the first embodiment.
Figure 12A:
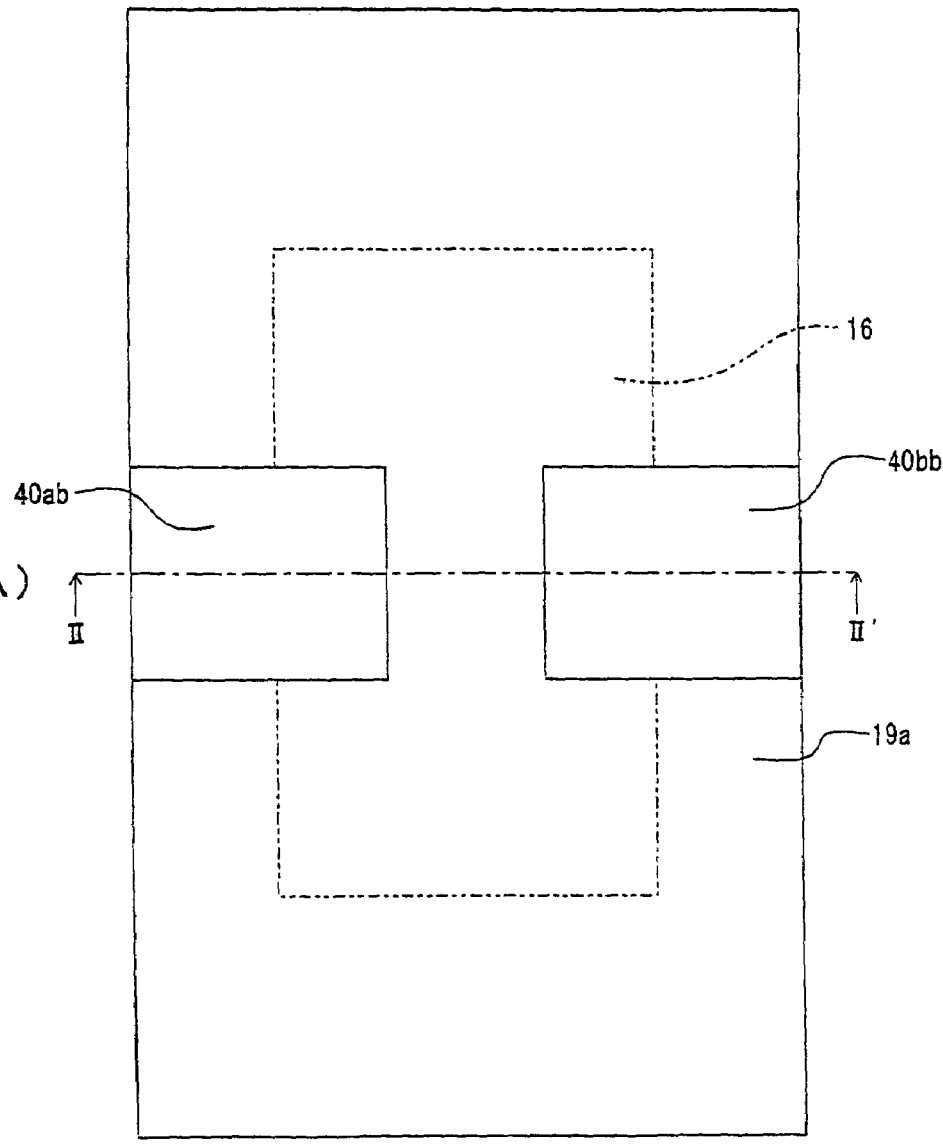
FIG. 12(A) is a schematic top view of the semiconductor device in the process after the one of FIG. 11(A).
Figure 12B:
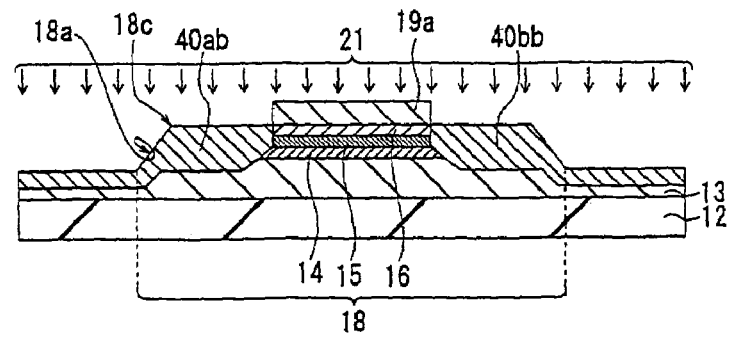
FIG. 12(B) is a schematic cross-sectional view taken along the line II-II' of FIG. 12(A).
Figure 13A:
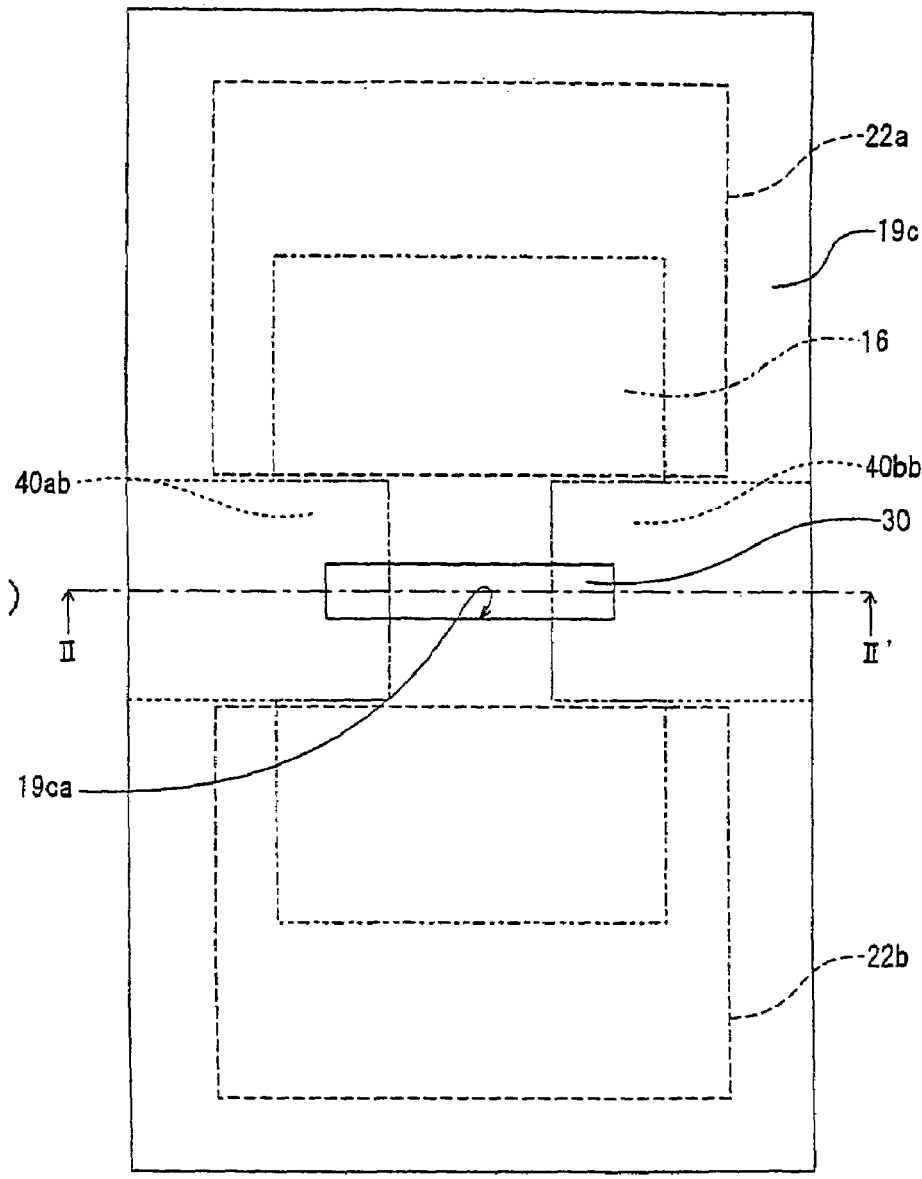
FIG. 13(A) is a schematic top view of the semiconductor device in the process after the one of FIG. 12(A).
Figure 13B:
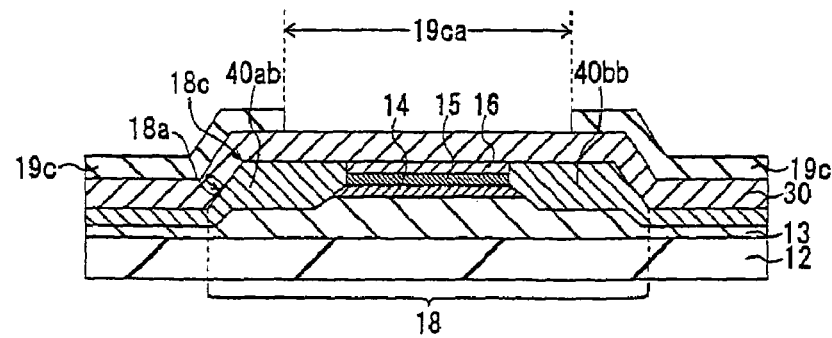
FIG. 13(B) is a schematic cross-sectional view taken along the line II-II' of FIG. 13(A).
Figure 14A:
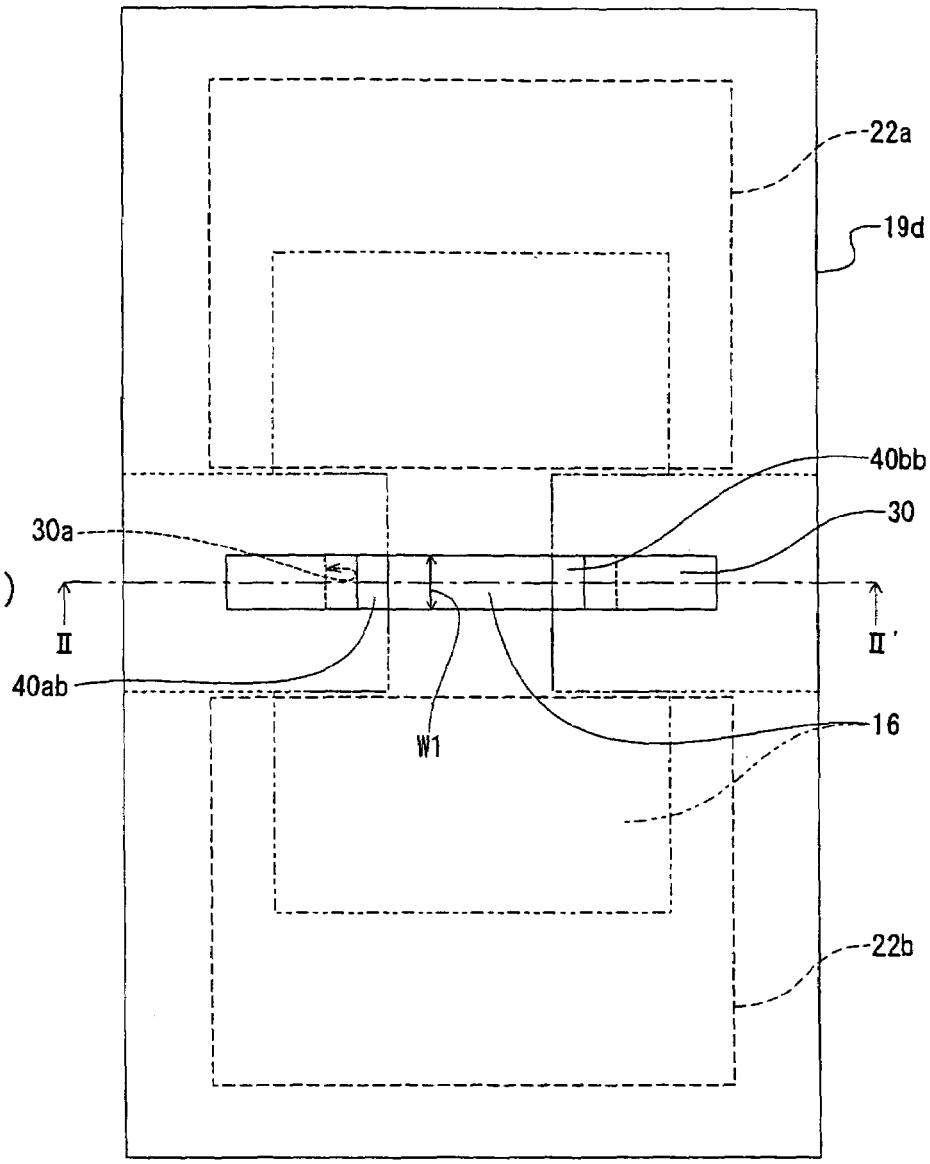
FIG. 14(A) is a schematic top view of the semiconductor device in the process after the one of FIG. 13(A).
Figure 14B:
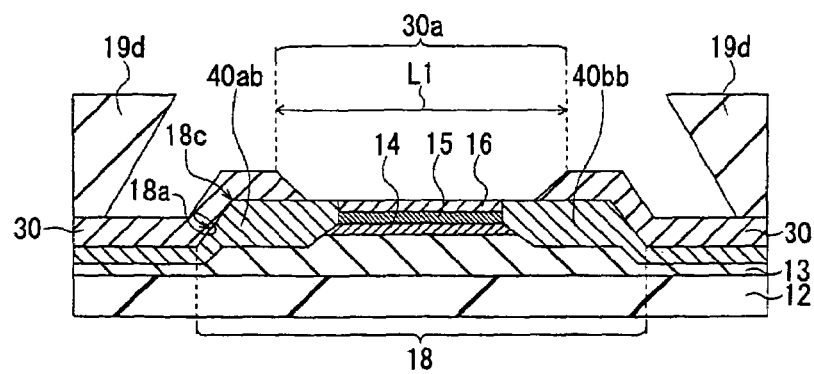
FIG. 14(B) is a schematic cross-sectional view taken along the line II-II' of FIG. 14(A).
Figure 15A:
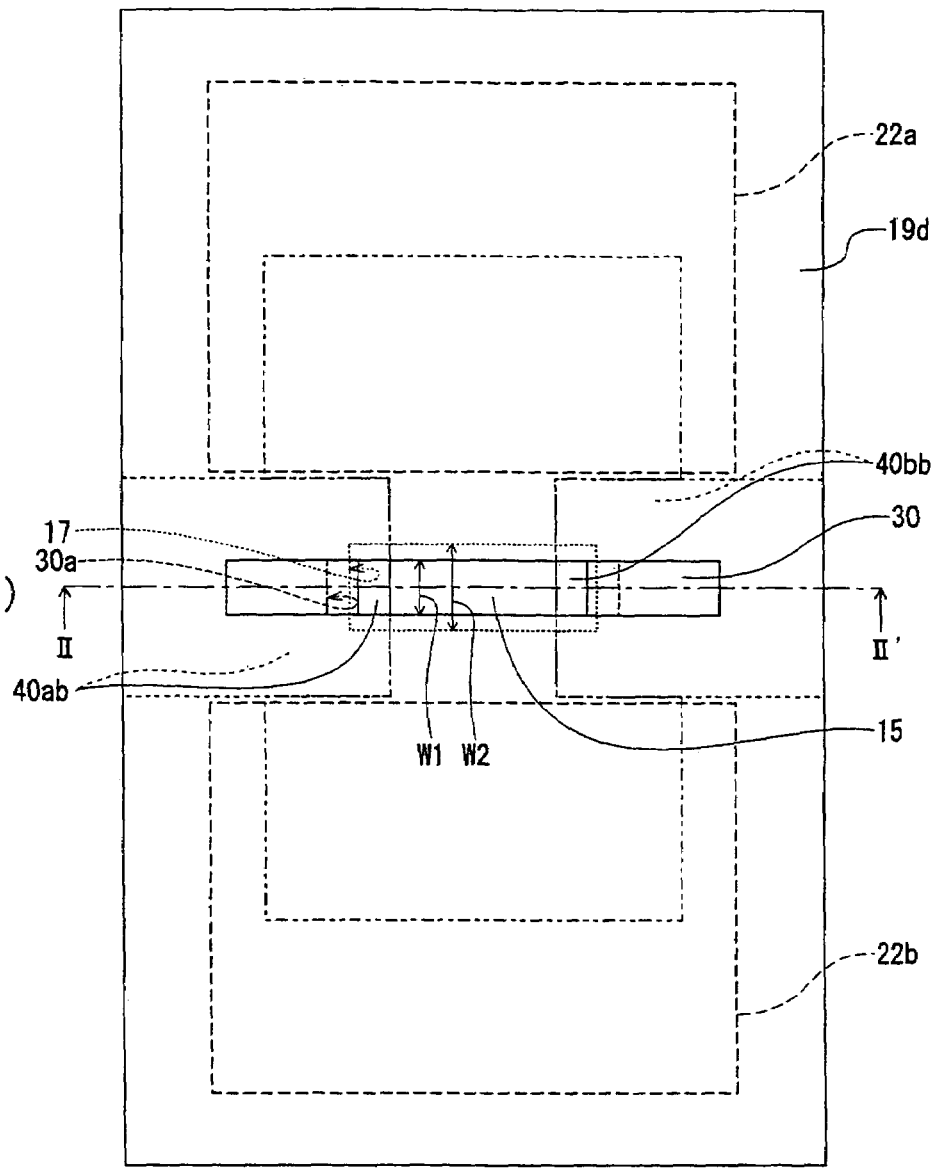
FIG. 15(A) is a schematic top view of the semiconductor device in the process after the one of FIG. 14(A).
Figure 15B:
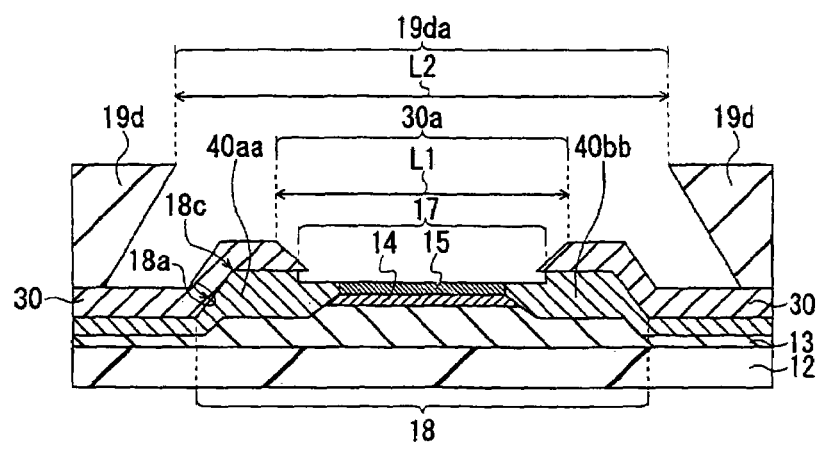
FIG. 15(B) is a schematic cross-sectional view taken along the line II-II' of FIG. 15(A).
Figure 16A:
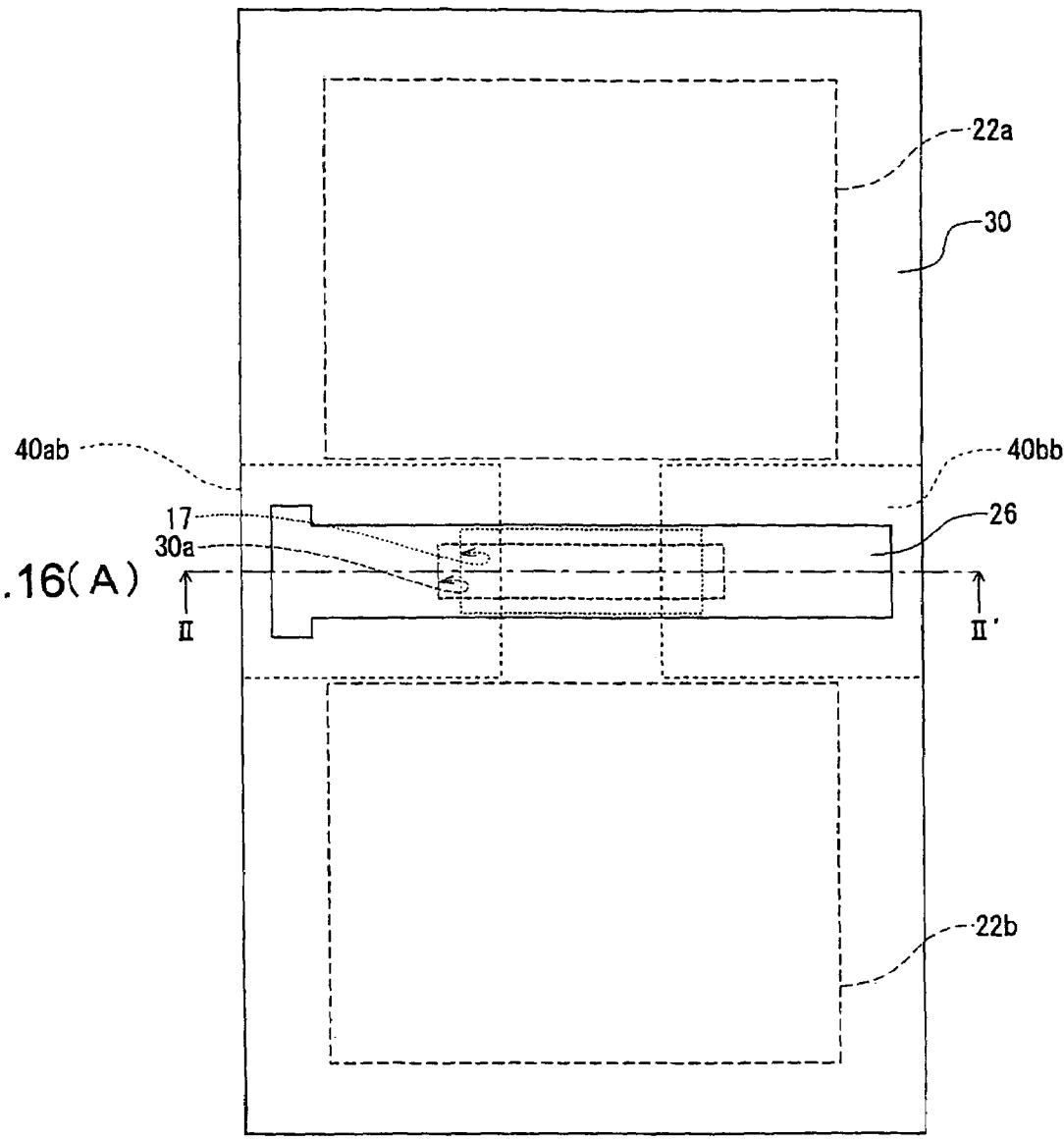
FIG. 16(A) is a schematic top view of the semiconductor device in the process after the one of FIG. 15(A)
Figure 16B:
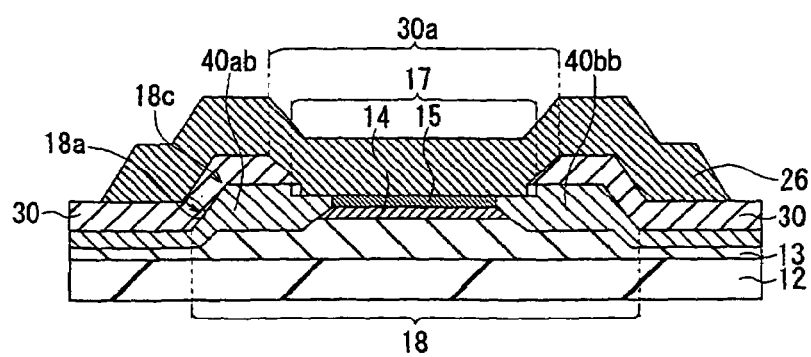
FIG. 16(B) is a schematic cross-sectional view taken along the line II-II' of FIG. 16(A).

FIG. 12(A) is a schematic top view of the semiconductor device in the process after the one of FIG. 11(A). FIG. 12(B) is a schematic cross-sectional view taken along the line II-II' of FIG. 12(A). FIG. 13(A) is a schematic top view of the semiconductor device in the process after the one of FIG. 12(A). FIG. 13(B) is a schematic cross-sectional view taken along the line II-II' of FIG. 13(A). FIG. 14(A) is a schematic top view of the semiconductor device in the process after the one of FIG. 13(A). FIG. 14(B) is a schematic cross-sectional view taken along the line II-II' of FIG. 14(A). FIG. 15(A) is a schematic top view of the semiconductor device in the process after the one of FIG. 14(A). FIG. 15(B) is a schematic cross-sectional view taken along the line II-II' of FIG. 15(A). FIG. 16(A) is a schematic top view of the semiconductor device in the process after the one of FIG. 15(A). FIG. 16(B) is a schematic cross-sectional view taken along the line II-II' of FIG. 16(A).

The process of forming the layered structure 20 of compound semiconductor and the setting of the active layer forming region 20' and the mesa structure region 18' can be performed similarly to the first embodiment. Therefore, in the description below, they are described referring to FIG. 3, and the illustration of those processes are omitted. As shown in FIGS. 3(A) and 3(B), the layered structure 20 of compound semiconductor, which contains the active channel layer 14, is formed on the semiinsulating substrate 12. This layered structure 20 is formed by epitaxially growing a plurality of compound semiconductor layers 13a, 14a, 15a and 16a on the semiinsulating substrate 12 in this order. In this example, InAlAs preliminary buffer layer 13a is first formed on the InP substrate 12, which is a semiinsulating substrate.

As shown in FIG. 3, the active layer forming region 20' and the mesa structure forming region 18' are set on the layered structure 20 in advance. Here, the active layer forming region 20' means a partial region, where the active channel layer 14 will finally remain.

Figure 11B:
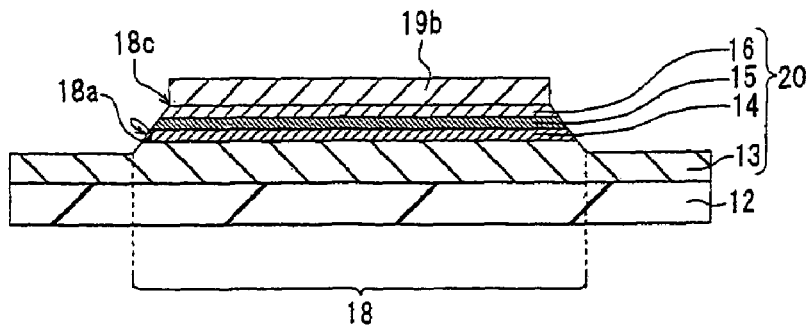
FIG. 11(B) is a schematic cross-sectional view of the semiconductor device in the manufacturing process, which is taken along the line II-II' of FIG. 11(A).

As shown in FIGS. 11(A) and 11(B), the mesa structure 18 is formed in the mesa structure forming region 18' by the mesa etching process, which will be described below. To perform this process, the mesa structure forming resist layer (resist pattern) 19b, which is a rectangular region that covers the mesa structure forming region 18' (FIG. 4(A)), is formed on the surface of the layered structure 20 of compound semiconductor.

The mesa etching is performed on the layered structure 20 using the mesa structure forming resist pattern 19 as a mask. This mesa etching is performed on the circumferential region of the resist pattern 19b from the upper surface of the layered structure, i.e. upper surface of the preliminary capping layer 16a, until the region under the active channel layer is exposed. For example, this mesa etching can be done to the middle depth level of the preliminary buffer layer 13a.

Then, by removing the mesa structure resist pattern 19b, the mesa structure 18, which is the remaining layered structure 20, is obtained. This mesa structure 18 is a region which remains as the buffer layer 13, the active channel layer 14, the donor layer 15 and the capping layer 16. Then, as shown in FIGS. 12(A) and 12(B), the first and the second mesa ion implantation regions 40ab and 40bb are formed. For this process, the active layer forming resist pattern 19a is first formed as a mask pattern (resist pattern) to cover the active layer forming region 20', which is a partial region of the mesa structure 18.

Thereafter, with well-known ion implantation device, specified ions 21 are implanted in the region of the mesa structure, which is exposed around the resist pattern 19a from the upper surface of the buffer layer 13 to the middle depth level of the buffer layer. For example, in this case, the ion implantation is performed from the surface of the mesa structure 18 to the depth level below the active channel layer 14. Then, the active channel layer forming resist pattern 19a is removed. By this ion implantation process, the first and the second mesa ion implantation regions 40ab and 40bb are formed on the upper surface of the buffer layer 13, which is not covered by the mask pattern, i.e. the active layer forming resist pattern 19.

In other words, the first and the second semiinsulating ion implantation regions 40ab and 40bb are formed on the layered structure 20 of compound semiconductor. The first and the second mesa ion implantation regions 40ab and 40bb are formed even in the regions outside the edges 18c, i.e. regions outside the mesa structure 18, in addition to the region inside the edges 18c of the mesa structure 18.

The first and the second mesa ion implantation regions 40ab and 40bb are formed facing each other across the narrow section of the non-ion implantation region, where ions are not implanted being covered by the mask pattern 19a. In other words, with the above ion implantation process, the portion of the mesa structure 18, which is not covered by the mask pattern, remains as the non-ion implantation region. This remaining region contains the first and the second mesa expanded sections and the narrow section which connects between the mesa expanded sections.

As shown in FIG. 13(A), the first and the second metal main electrodes 22a and 22b, which are away from each other, are formed on the mesa structure 18. Thereafter, the interlayer spacer film (interlayer insulating film) 30, which covers the first and the second mesa ion implantation regions 40ab and 40bb, the buffer layer 16, and the first and the second metal main electrodes 22a and 22b, is formed. Then, as shown in FIGS. 13(A) and 13(B), the opening forming resist pattern 19c for making an opening 30a (FIG. 14(B)) on the interlayer spacer film 30 is formed on the interlayer spacer film 30.

As shown in FIGS. 14(A) and 14(B) the opening 30 which exposes the InGaAs capping layer 16 is formed on the interlayer spacer film 30 by removing a part of the interlayer spacer film 30 by etching using the opening forming resist pattern 18c as a mask. This opening 30a has a length L1 larger than the contact length of the metal control electrode to contact with the donor layer 15, which is along the channel width direction, and has the same width w1 as the contact width which is along the channel length direction.

As also shown in FIGS. 15(A) and 15(B), the metal control electrode forming resist layer (resist pattern) 19d is formed. The shape and size of the opening 19da of the metal control electrode forming resist pattern 19d should be suitably set, according to the shape and size of the metal control electrode 26 to be formed, similarly to the first embodiment. Similarly to the first embodiment, a recess etching process is performed onto the n+-InGaAs capping layer 16. At this time, the recess 17 is formed such that the both ends of the recess in the extending direction are respectively arranged in the first and the second mesa ion implantation regions 40ab and 40bb.

Figure 26A:
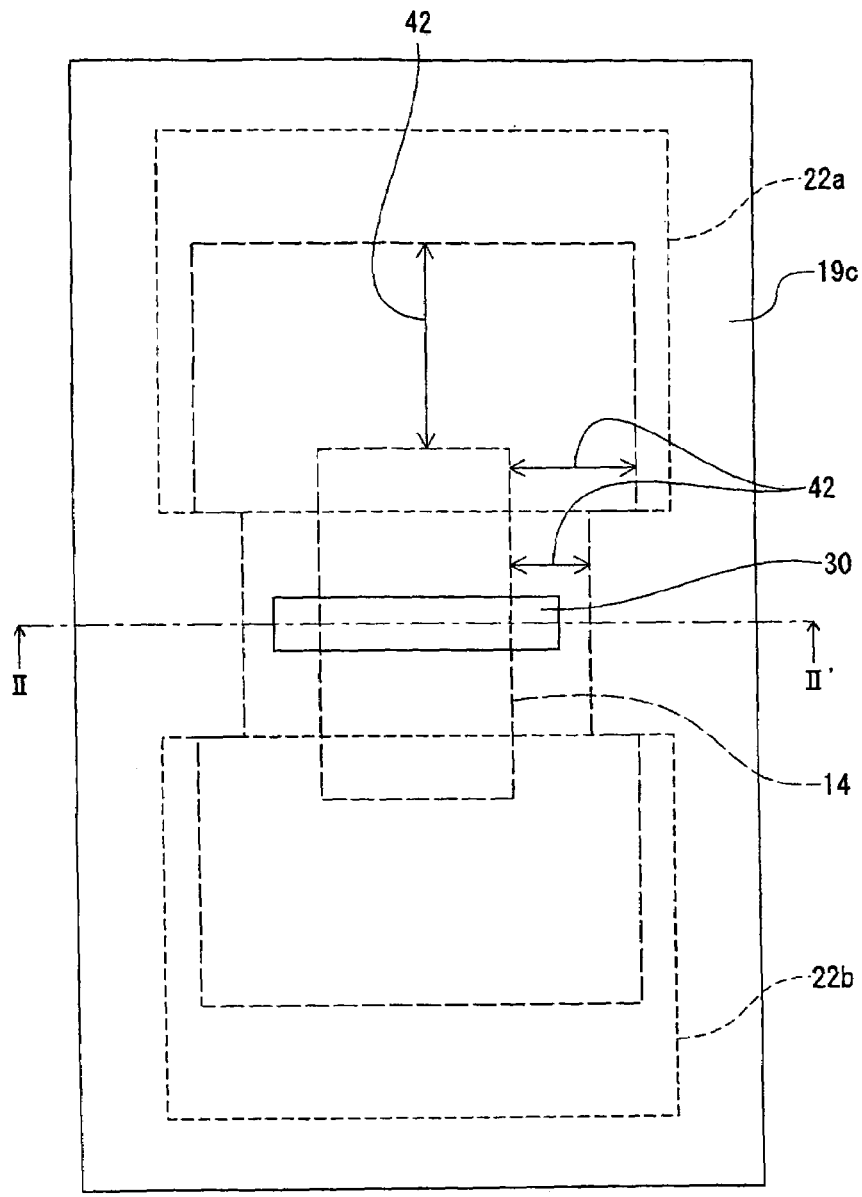
FIG. 26(A) is a schematic top view of the semiconductor device in the process after the one of FIG. 25(A).
Figure 26B:
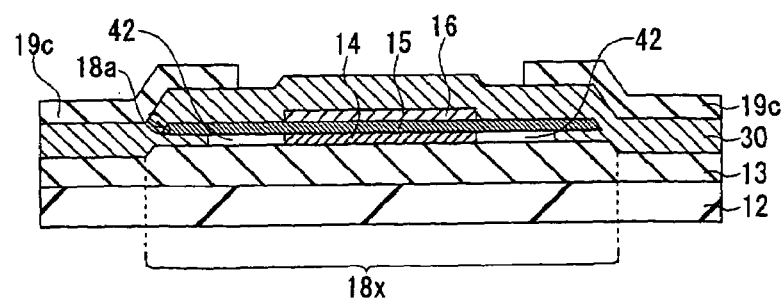
FIG. 26(B) is a schematic cross-sectional view taken along the line II-II' of FIG. 26(A).
Figure 27A:
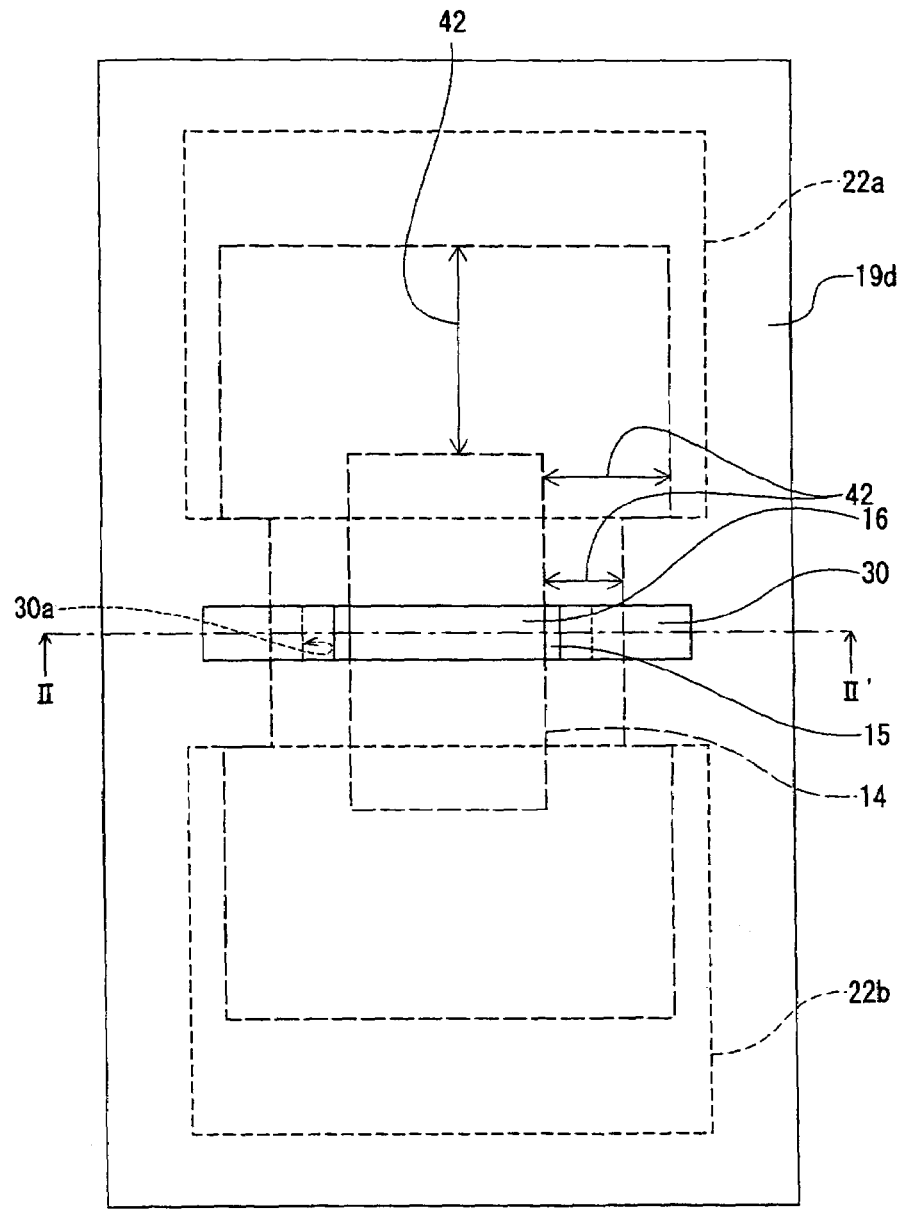
FIG. 27(A) is a schematic top view of the semiconductor device in the process after the one of FIG. 26(A).
Figure 27B:
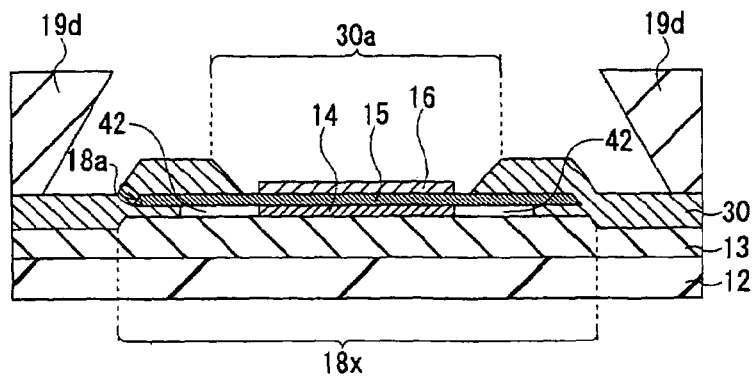
FIG. 27(B) is a schematic cross-sectional view taken along the line II-II' of FIG. 27(A).
Figure 28A:
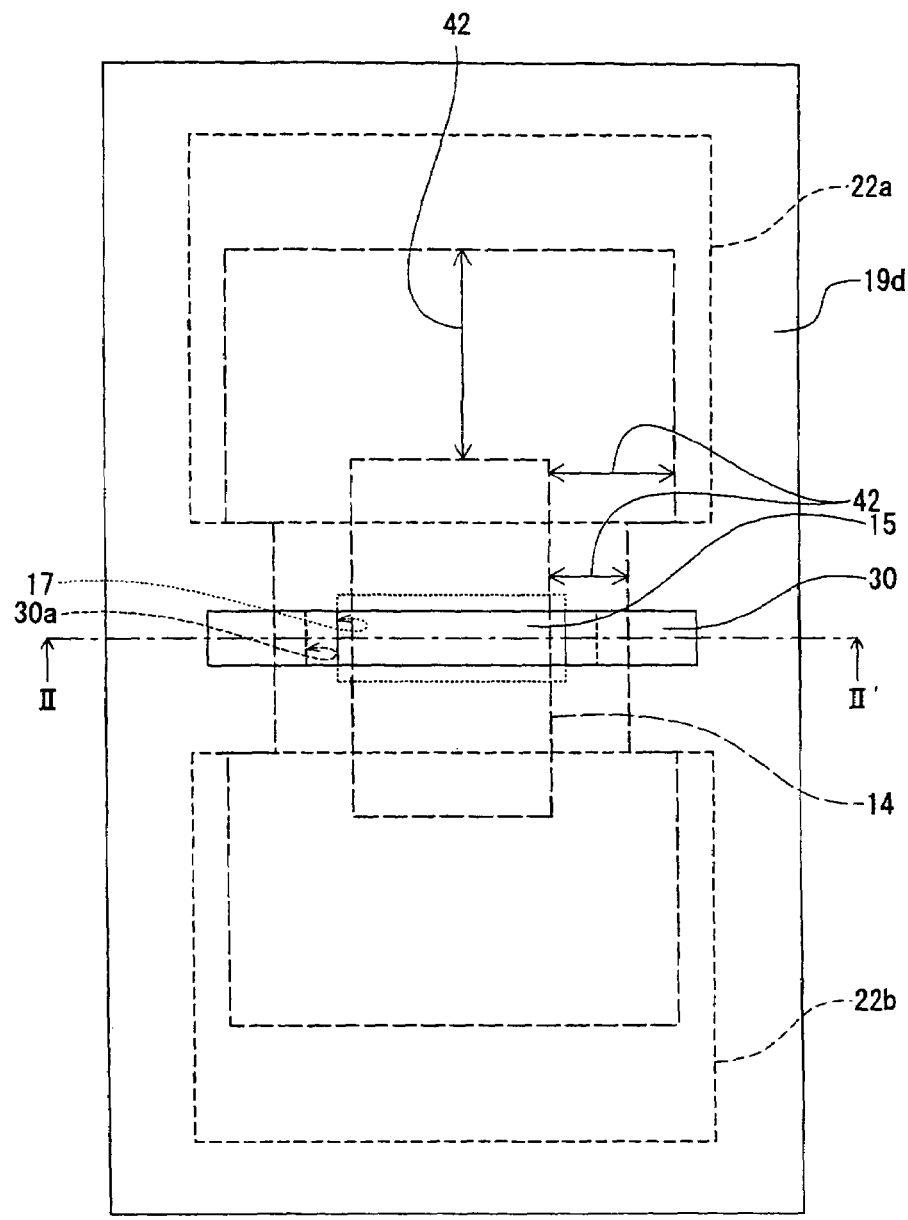
FIG. 28(A) is a schematic top view of the semiconductor device in the process after the one of FIG. 27(A).
Figure 28B:
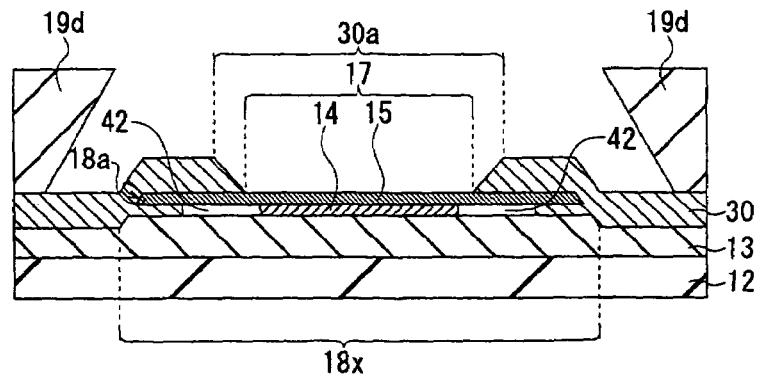
FIG. 28(B) is a schematic cross-sectional view taken along the line II-II' of FIG. 28(A).
Figure 29A:
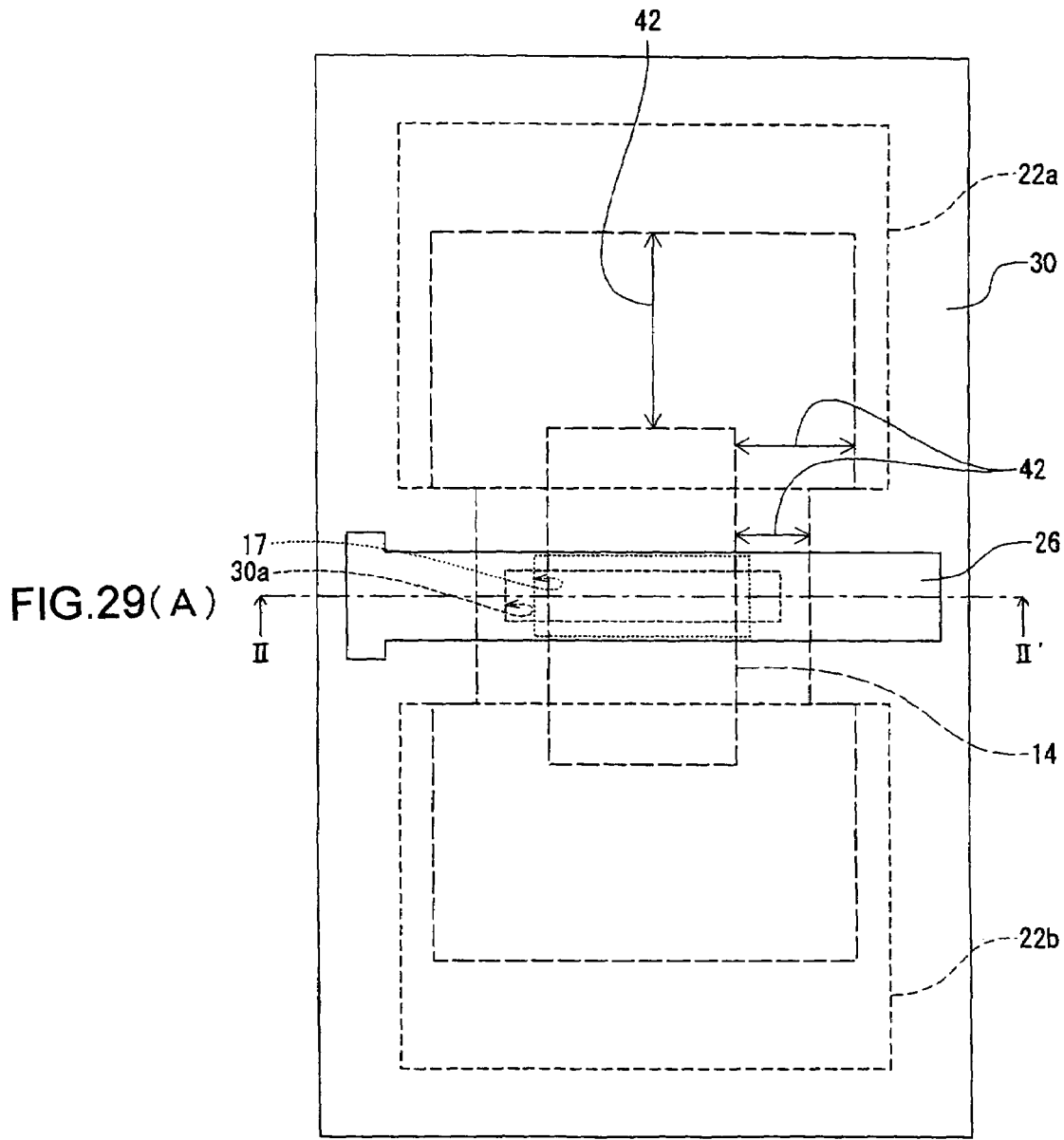
FIG. 29(A) is a schematic top view of the semiconductor device in the process after the one of FIG. 28(A).
Figure 29B:
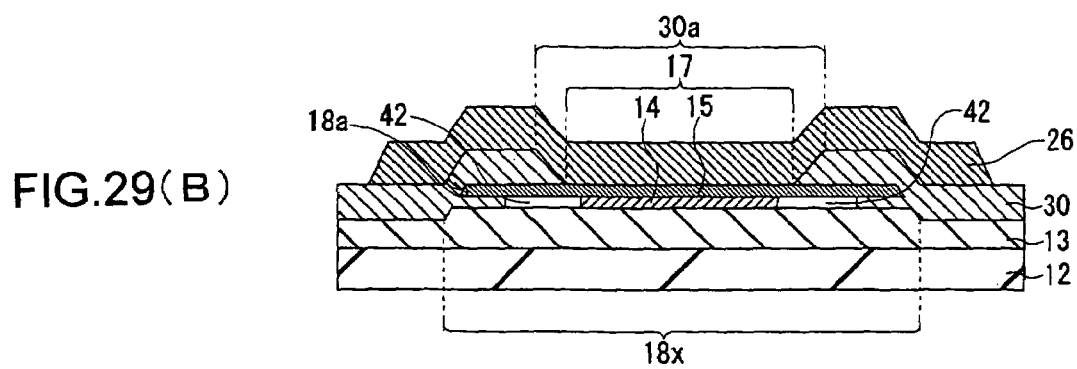
FIG. 29(B) is a schematic cross-sectional view taken along the line II-II' of FIG. 29(A).

Then, as shown in FIGS. 16(A) and 26(B), the metal control electrode 26 is formed by performing a metal deposition process under any suitable conditions using the metal control electrode forming resist pattern 19d as a mask. The metal deposition film is formed on the donor layer 15 filling the opening 30a and a part of the recess 17 provided continuously from the opening 30a, and continuously formed on the interlayer spacer layer 30. Then, by performing a lift-off process of the resist pattern 19d, the resist pattern 19d is removed. By this lift-off process, the remaining metal deposition film becomes the metal control electrode 26, similarly to the first embodiment.

According to the series of the processes described above, the semiconductor device in the example of modification of the first embodiment is manufactured. By forming the semiconductor device 10 as described above, the active channel layer is covered by the interlayer insulating film, especially in the recess etching process. Therefore, the active channel layer can be even more securely protected. Accordingly, the reduction or loss of performances due to the contamination of the active channel layer 14 by the etchant can be prevented in the process of forming the metal control electrode 26, similarly to the first embodiment.

Second Embodiment 2-1. Constitution of the Semiconductor Device

Figures 17A, 17B, 17C:
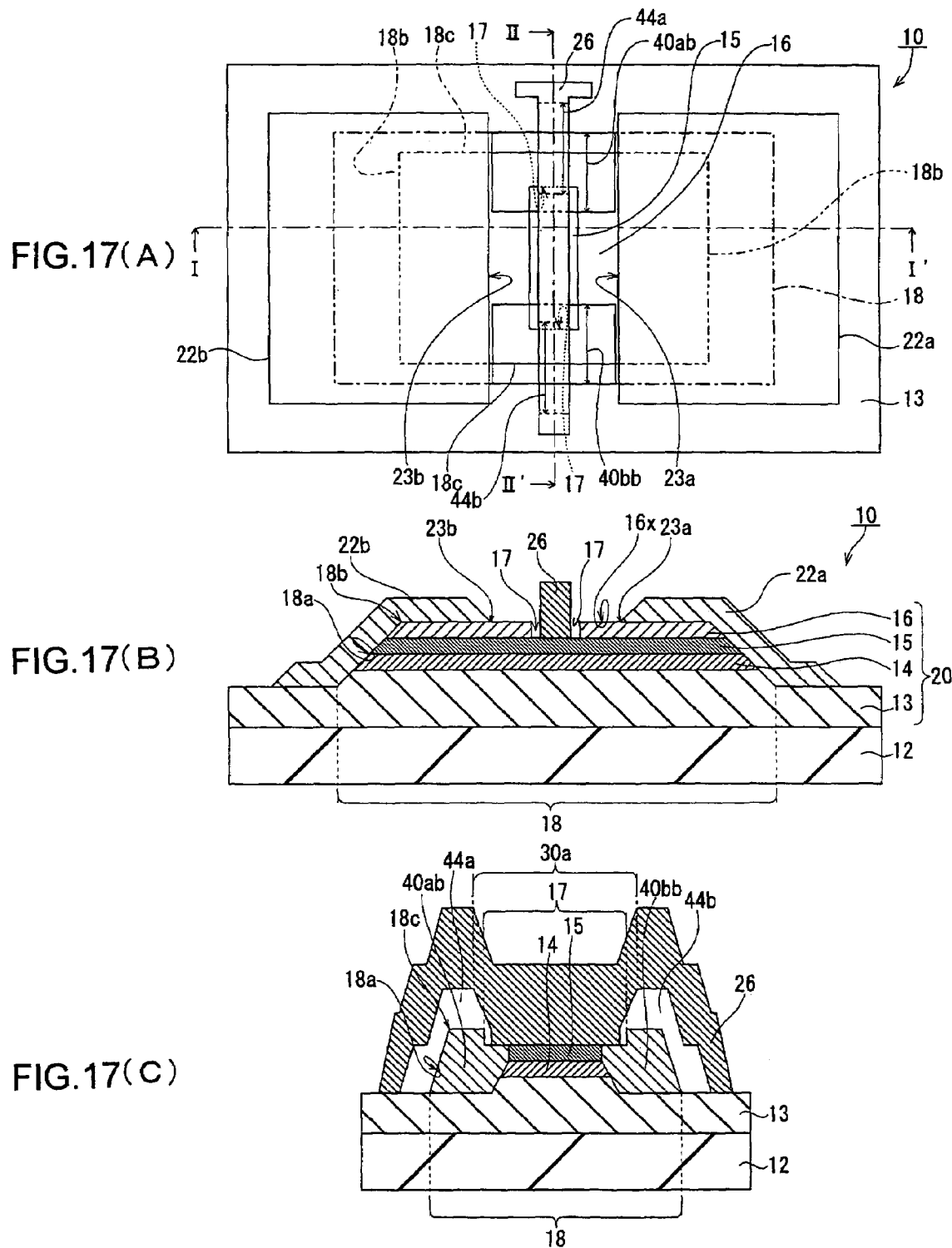
FIG. 17(A) is a schematic top view of the semiconductor device of the second embodiment, illustrating the arrangement of each element.
FIG. 17(B) is a schematic cross-sectional view taken along the line I-I' of FIG. 17(A).
FIG. 17(C) is a schematic cross-sectional view taken along the line II-II' of FIG. 17(A).

Referring to FIG. 17, the constitution of the semiconductor of the second embodiment is described below. Elements similar to those described in the first embodiments are denoted by the same reference numerals, and the explanation may be omitted. FIG. 17(A) is a schematic top view of the semiconductor device of the second embodiment, illustrating the arrangement of each element. FIG. 17(B) is a schematic cross-sectional view taken along the line I-I' of FIG. 17(A). FIG. 17(C) is a schematic cross-sectional view taken along the line II-II' of FIG. 17(A).

Also in the example of the constitution of the second embodiment, similarly to the first embodiment, the layered structure 20 of compound semiconductor, which is formed as the mesa structure containing the active channel layer 14, is formed on the semiinsulating substrate 12. In addition, the first and second semiinsulating mesa ion implantation regions 40ab and 40bb are provided as "islands (isolated regions)" in the region of the mesa structure 18 which is exposed between the first and the second metal main electrodes 22a and 22b.

The difference of the semiconductor device of the second embodiment from that of the first embodiment is formation of an air-bridge by an air-gap in place of forming the interlayer spacer film 30 between the first and the second mesa ion implantation regions 40ab and 40bb and the metal electrode 26. The first and the second mesa ion implantation regions 40ab and 40bb are provided to extend to the depth level below the active channel layer 14, which is an electron transit layer.

As understandable from FIGS. 17(A) and 17(C), a first and second air-bridges 44a and 44b, which are cavities to isolate the metal control electrode 26 from the first and the second mesa ion implantation regions 40aa and 40bb on a part of the upper-surface and the side surfaces of the mesa structure, are provided on the first and the second mesa ion implantation regions 40ab and 40bb, which are partial regions of the mesa structure, directly under the metal electrode 26. In other words, the metal control electrode 26 is provided over the tilted surface 18a of the mesa structure 18, not contacting with the surfaces 18a because of the first and the second air-bridges 44a and 44b. Therefore, the air-bridges 44a and 44b isolate the metal control electrode 26 from the surfaces 18a of the mesa structure 18.

As described above, according to the semiconductor device 10 of this embodiment, the first and the second air-bridges 44a and 44b are respectively provided on the first and second semiinsulating mesa ion implantation regions 40a and 40b, which are similar to those in the first embodiment. Therefore, by more securely isolating the active channel layer 14 from the metal control electrode 26, the reliability in the operation of the semiconductor device can be further improved.

2-2. Method of Manufacturing the Semiconductor Device

Referring now to FIGS. 18-21, a method of manufacturing the semiconductor device of the second embodiment, which are described above referring to FIGS. 17(A)-17(C), will be described below. Here, detailed explanation of processes which can be regarded similar to the ones in the first embodiment in view of the materials and conditions are omitted. FIG. 18(A) is a schematic top view illustrating the process of manufacturing the semiconductor device of the second embodiment. FIG. 18(B) is a schematic cross-sectional view of the semiconductor device in the manufacturing process, which is taken along the line II-II' of FIG. 18(A). FIG. 19(A) is a schematic top view of the semiconductor device in the process after the one of FIG. 18(A). FIG. 19(B) is a schematic cross-sectional view taken along the line II-II' of FIG. 19(A). FIG. 20(A) is a schematic top view of the semiconductor device in the process after the one of FIG. 19(A). FIG. 20(B) is a schematic cross-sectional view taken along the line II-II' of FIG. 20(A). FIG. 21(A) is a schematic top view of the semiconductor device in the process after the one of FIG. 20(A). FIG. 20(B) is a schematic cross-sectional view taken along the line II-II' of FIG. 20(A).

As shown in FIG. 18(A), the layered structure 20 of compound semiconductor is formed by epitaxially growing a plurality of compound semiconductor layers 13a, 14a, 15a and 16a successively, similarly to the first embodiment described above referring to FIG. 3(A). Similarly to the first embodiment, the active layer forming region 20' and the mesa structure forming region 18' are set on the layered structure 20 in advance.

Then, as shown in FIG. 18(B), the active layer forming resist layer (resist pattern) 19a to cover the active layer forming region 20' which is set as described above is formed. Similarly to the first embodiment, using a well-known ion implantation device, the ion implantation of specified ions 21 is performed on the layered structure 20, on which the active layer forming resist pattern 19a is provided, and the ion implantation layer (region) 40 is formed.

The depth levels of the first and the second ion implantation layers 40a and 40b are set below the preliminary active channel layer 14a. In this example, the ions 21 are implanted from the upper surface of the InAlAs preliminary buffer layer 13a to the middle depth level of the preliminary buffer layer 13a. By this ion implantation process, the first and the second semiinsulating mesa ion implantation layers 40a and 40b are formed as isolated regions in the region outside the layered-structure covered by the active layer forming resist pattern 19a. Then, the capping layer 16 is exposed by removing the active layer forming resist pattern 19a.

In next, as shown in FIG. 18(C), the mesa structure forming layer (resist pattern) which covers the capping layer 16 and the ion implantation layers 40 (40a and 40b). This resist pattern 19b is similar to that described in the first embodiment, and is a mask pattern having the first and the second expanded sections 19aa1 and 19aa2 and the narrow section 19ab that connects the expanded section (See FIG. 4(A)). As described above, this mesa structure 18 is a structure for performing a semiconductor isolation.

In next, the exposed portion of the ion implantation layer 40 is removed by etching the portion using the mesa structure forming resist layer 19b as a mask. By this etching, the remaining portions of the ion implantation layers become the first and the second mesa ion implantation regions 40ab and 40bb. In addition, non-ion implantation region remains under the mask pattern 19b, and this non-ion implantation region has the first and the second mesa expanded sections 19ba and 19bb and the narrow section 19ab, corresponding to the mask pattern 19b (See FIG. 5(A)). Then, by removing the mesa structure forming resist layer 19b, the mesa structure 18 which contains the first and the second mesa ion implantation regions 40ab and 40bb and layers 14, 15, and 16, is obtained.

Figure 19A:
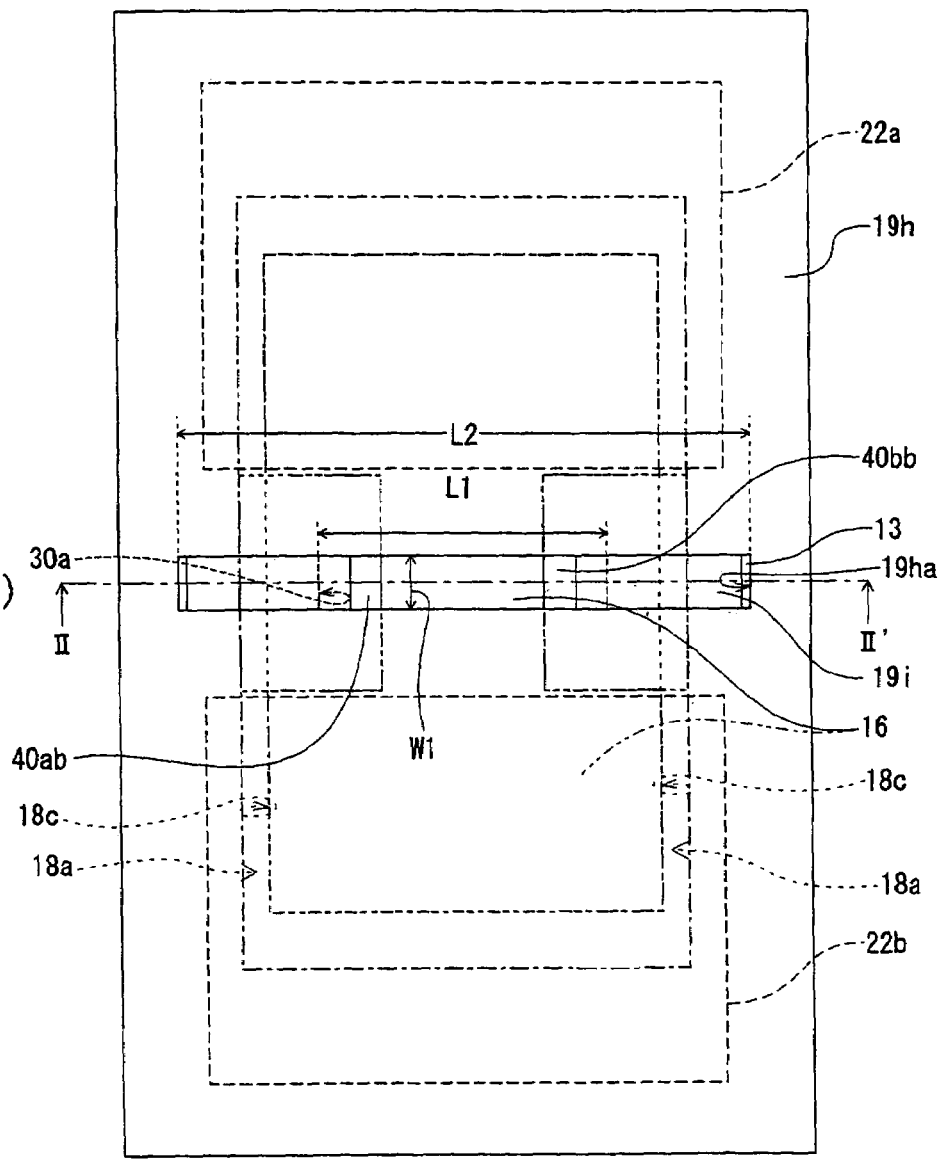
FIG. 19(A) is a schematic top view of the semiconductor device in the process after the one of FIG. 18(A).
Figure 19B:
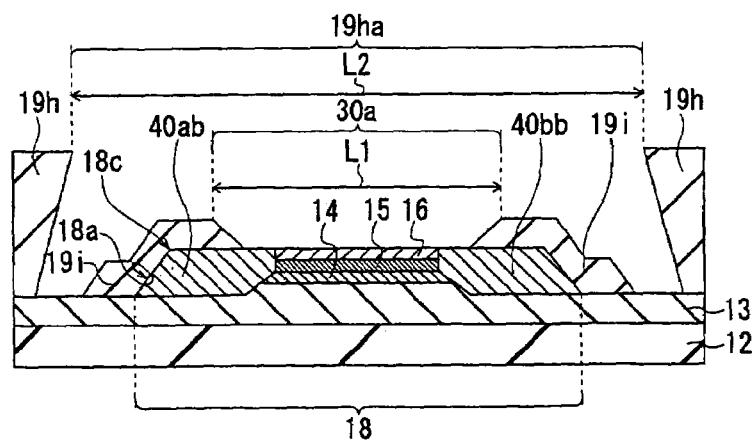
FIG. 19(B) is a schematic cross-sectional view taken along the line II-II' of FIG. 19(A).

As shown in FIGS. 19(A) and 19(B), the first and the second metal main electrodes 22a and 22b are formed on the above-formed mesa structure, being away from each other. Then, the recessing resist layer (resist pattern) 19h, the air-bridging resist layer (resist pattern) 19i, and the first and the second openings 30a and 19ha are formed by respective well-known photolithography techniques. In this case, preferably, the resist pattern 19i is first formed as the first resist layer, and then the resist pattern 19h is formed as the second resist layer. However, depending on the design, the resist pattern 19h can be formed before forming the resist pattern 19i. In the constitution of this example, the second resist layer 19h is laid on the first resist layer 19i. Here, the first opening 30a of the first resist layer 19i and the second opening 19ha of the second resist layer 19h are provided so as to be vertical to the substrate surface. The second opening 19ha is connected to the first opening 30a and provided so as to be symmetrical about the first opening 30a. The widths of the first and the second openings 30a and 19ha in the direction connecting between the main electrodes is set same as the width w1 of the control electrode to be formed on the mesa structure 18.

The air-bridging resist layer (first resist layer) 19i is a region where the active channel layer 14 is exposed between the first and the second metal main electrodes, and to have a thin rectangular shape so as to define the both ends of the first opening 30a and cover the region that corresponds to the region right under the metal control electrode 26 that will be formed later. More specifically, the first resist layer 19i consists of two portions that are arranged away from each other, and covers the two side surfaces 18a of the mesa structure 18 covering over the two facing edges 18c which are exposed from the upper surfaces of the first and the second mesa ion implantation regions 40ab and 40bb.

Since the above-described recessing resist pattern 19h is also a mask pattern for forming the metal control electrode 26, which will be described later, it works as a mask pattern for forming both recess 17 and metal control electrode 26. Therefore, the shape of the second opening 19ha of the recessing resist layer 19h should correspond to the shape of the metal control electrode 26 to be formed. More specifically, the recessing resist layer (second resist layer) 19h is formed similarly to the resist pattern 19d which is described in the first embodiment.

The second resist layer 19h is a mask pattern having the second opening 19ha, which covers the region except the opened portion by the second opening 19ha. The length L2 of the second opening 19ha in the extending direction should be long enough such that the opening extends at least crossing over one side surface of and then the other side surface 18a of the mesa structure 18. Accordingly, the first resist layer 19i is exposed from the second opening 19ha. As for the resist material of the recessing resist layer 19h used in this example, LMR (trade name) manufactured by Fuji Chemical Industrial Co., Ltd. is preferably used. As for the resist material of the air-bridging resist layer 19h, the resist material of the recessing resist layer 19h used in the recess etching process and a resist material which will not be eroded by the etchant are selected. For example, when the above-described LMR is used as the material for the air-bridging resist layer 19i, it is preferred to use it with ODUR (trade name) manufactured by Tokyo Ohka Kogyo Co., Ltd.

Figure 20A:
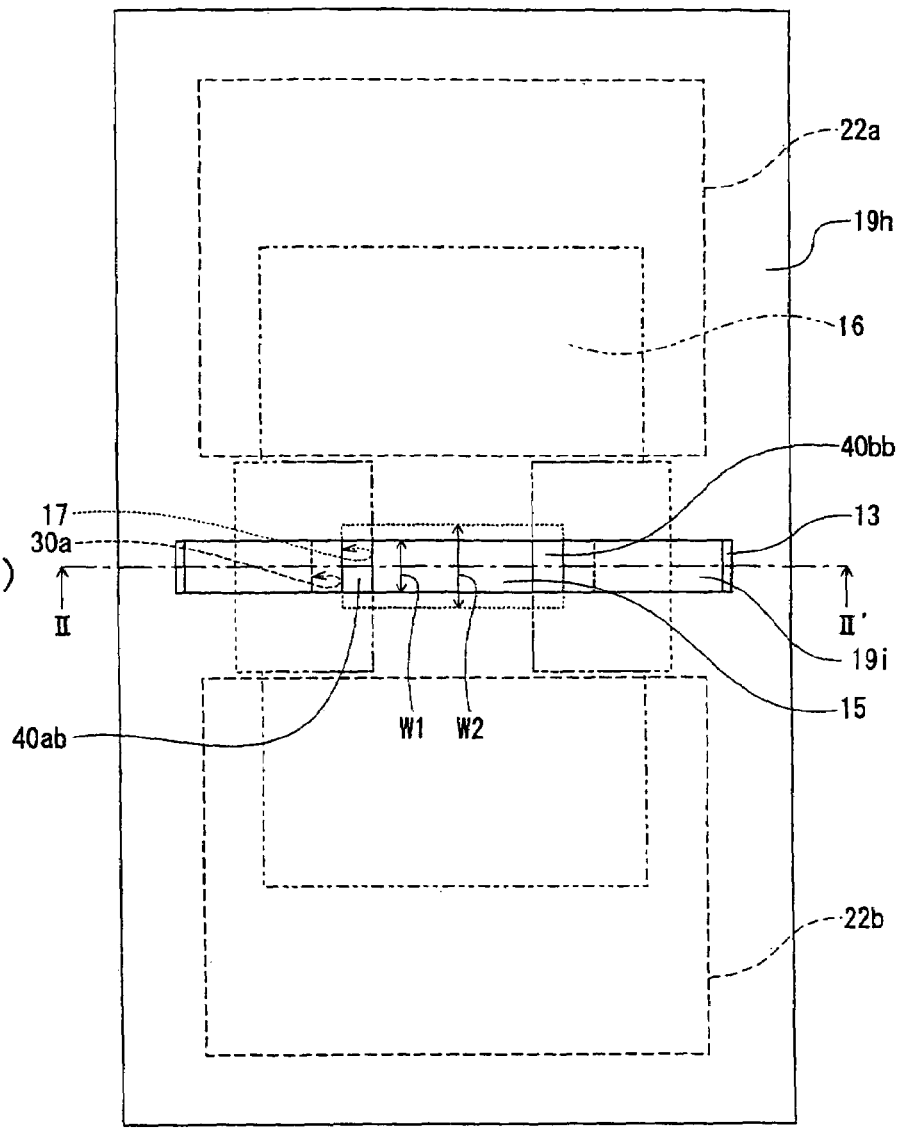
FIG. 20(A) is a schematic top view of the semiconductor device in the process after the one of FIG. 19(A).
Figure 20B:
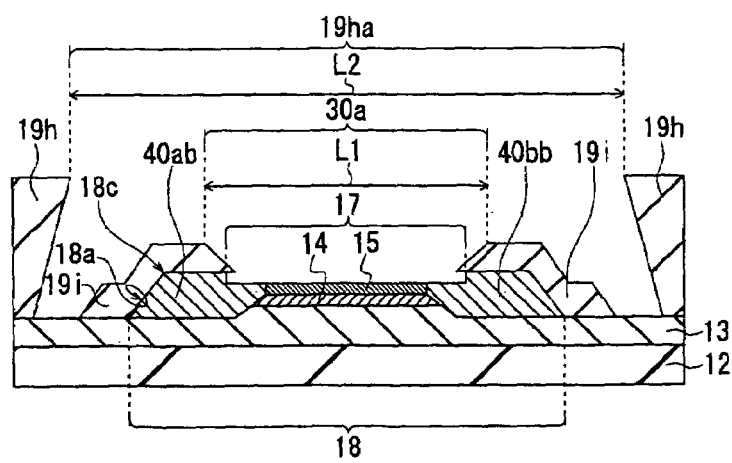
FIG. 20(B) is a schematic cross-sectional view taken along the line II-II' of FIG. 20(A).

Then, as shown in FIGS. 20(A) and 20(B), the recess 17, which exposes the InAlAs donor layer 15, is formed by etching using the recessing resist layer 19h and the air-bridging resist layer 19i as masks, similarly to the first embodiment. At this time, the capping layer 16 is etched, and the first and the second mesa ion implantation InGaAs regions 40ab and 40bb around the capping layer are also etched and removed. However, the exposed buffer layer 13 is not etched.

As shown in FIG. 20(B), the recess 17 is formed such that the ends of the recess in the channel width direction are arranged in the first and the second mesa ion implantation regions 40ab and 40bb.

As described above, since the recess etching process is performed while the active channel layer 14 is protected by the air-bridging resist pattern 19i and the first and the second mesa ion implantation regions 40ab and 40bb, the active channel layer 14 is not exposed from the side surface 18a. Therefore, there is no concern of erosion of he active channel layer 14 with the etchant used in the recess etching process.

Figure 21A:
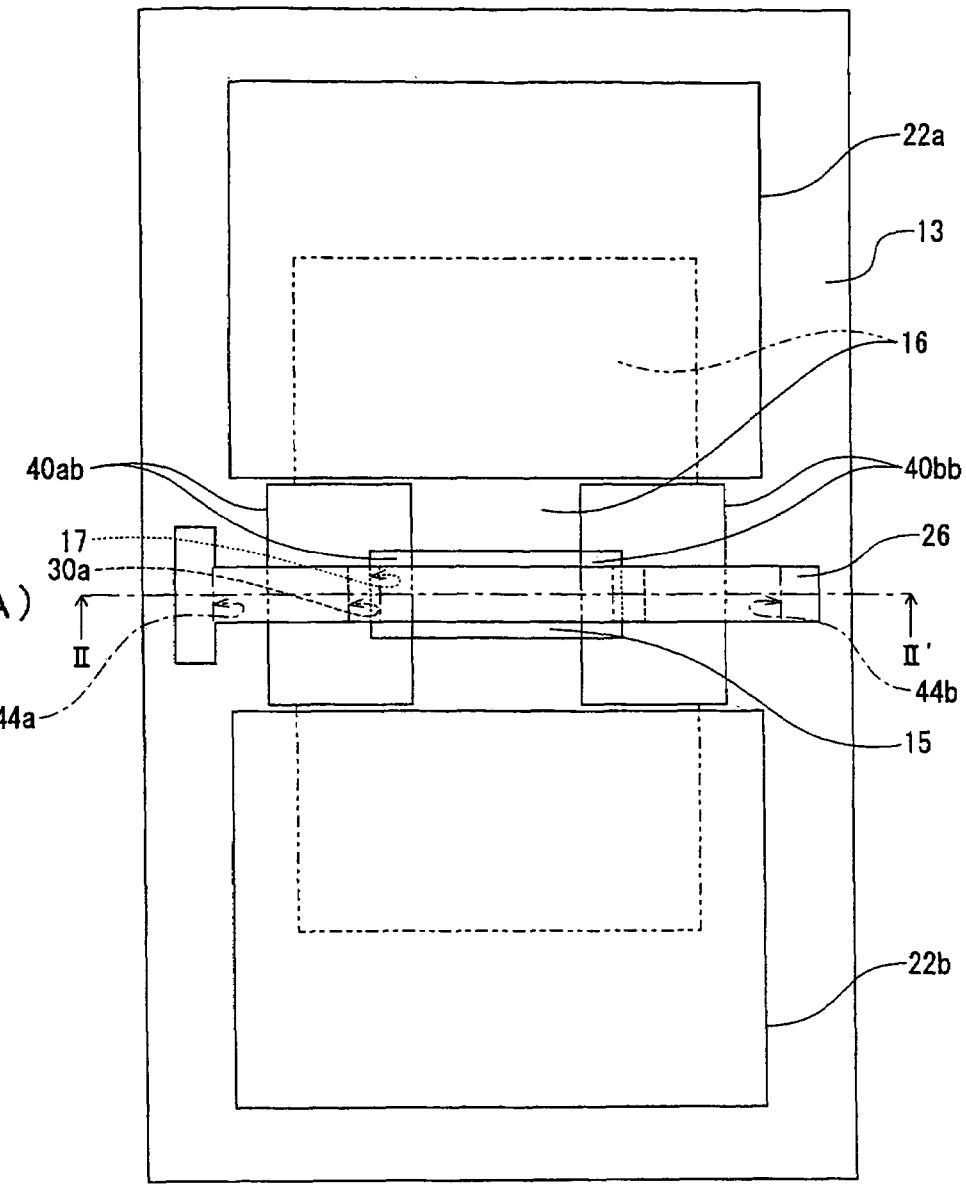
FIG. 21(A) is a schematic top view of the semiconductor device in the process after the one of FIG. 20(A).
Figure 21B:
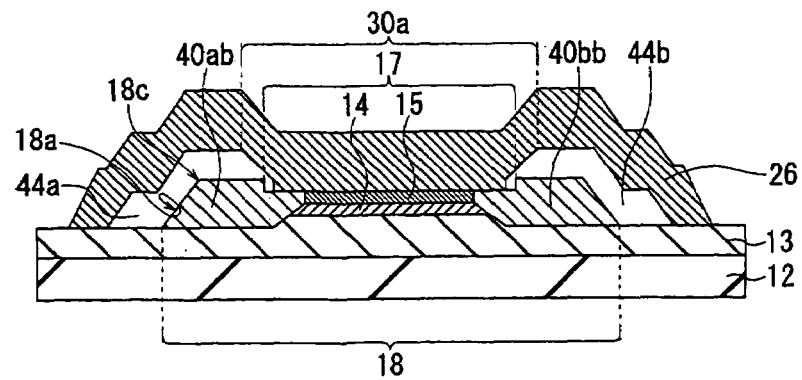
FIG. 21(B) is a schematic cross-sectional view taken along the line II-II' of FIG. 21(A).

Then, as shown in FIGS. 21(A) and 21(B), a metal deposition film is formed on the whole upper surfaces of the first and the second resist layers 19i and 19h so as to fill the second opening 19ha by performing the metal deposition process under any suitable conditions, similarly to the first embodiment, using the above-described recessing resist pattern 19h and the air-bridging resist pattern 19i as masks. This metal film is formed, filling a part of the recess 17. Thereafter, the metal control electrode 26 is formed, performing the lift-off process.

By this process of lifting off the resist pattern 19h, the air-bridging resist layer 19i is dissolved. Therefore, cavities, i.e. the first and the second air-bridges 44a and 44b, are respectively formed in regions between the first and the second mesa ion implantation layers 40ab and 40bb and the metal control electrode 26. As described above, it is preferred to select a material that dissolves in the lift-off process for the material of the air-bridging resist layer 19i.

According to the series of processes described above, the semiconductor device 10 of the second embodiment is manufactured. By manufacturing the semiconductor device 10 as described above, the active channel layer 14 is not exposed from the side surfaces 18a, so that the recess etching process can be performed while the active channel layer 14 is protected by the air-bridging resist pattern 19i. Therefore, the active channel layer 14 can be more securely protected. In addition, similarly to the effects of the first embodiment, the reduction or loss of the performance of the semiconductor device due to the contamination of the active channel layer 14 by the etchant in the recess etching process for forming the metal control electrode 26 can be prevented. Furthermore, since the metal control electrode is not exposed at the time of performing the recess etching process, there is no concern of the degradation of the semiconductor device caused by abnormal etching due to battery effect, which is a concern in conventional methods.

Third Embodiment 3-1. Constitution of the Semiconductor Device

Figure 22A:
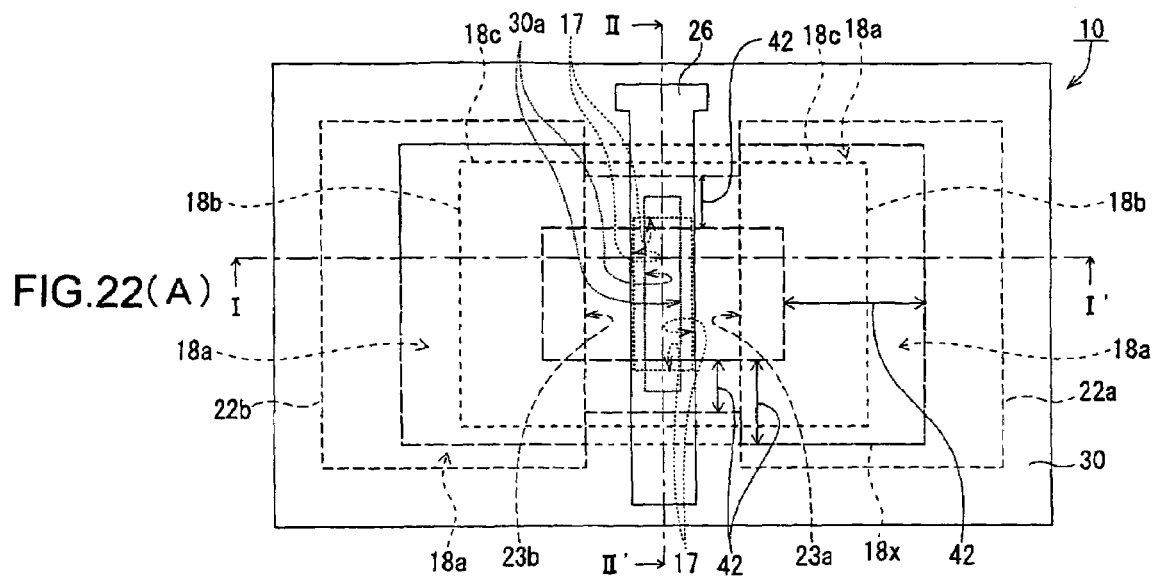
FIG. 22(A) is a schematic top view of the semiconductor device of the third embodiment, illustrating the arrangement of each element.
Figure 22B:
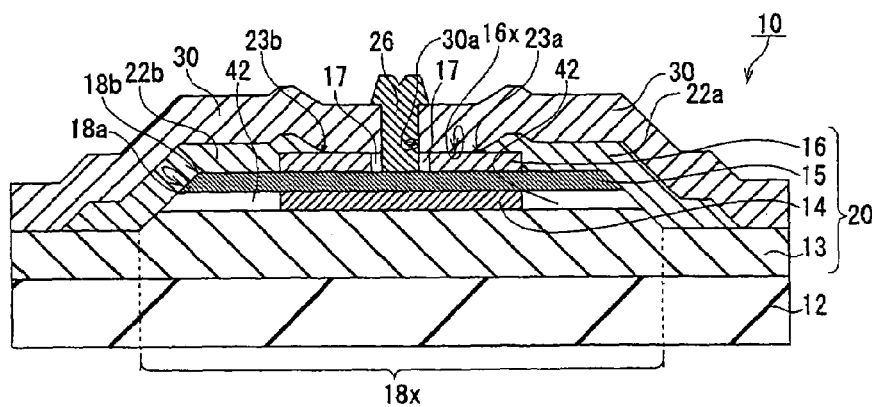
FIG. 22(B) is a schematic cross-sectional view taken along the line I-I' of FIG. 22(A).
Figure 22C:
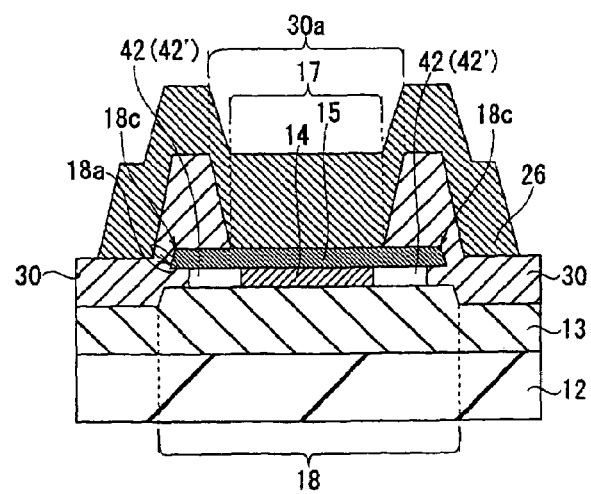
FIG. 22(C) is a schematic cross-sectional view taken along the line II-II' of FIG. 22(A).

Referring now to FIG. 22, the constitution of the semiconductor device of the third embodiment will be described. Here, elements similar to the ones already described in the first and the second embodiments are denoted by the same reference numerals, and the explanation may be omitted. In addition, in the explanation of the manufacturing process, if the materials or conditions are similar to those in the first and the second embodiment, detailed explanation will be omitted. FIG. 22(A) is a schematic top view of the semiconductor device of the third embodiment, illustrating the arrangement of each element. FIG. 22(B) is a schematic cross-sectional view taken along the line I-I' of FIG. 22(A). FIG. 22(C) is a schematic cross-sectional view taken along the line II-II' of FIG. 22(A).

The third embodiment is featured by forming a space around the active channel layer 14, which is provided between the buffer layer 13 and the donor layer 15, in place of using the first and the second mesa ion implantation regions 40ab and 40bb, which are included in the first and the second embodiments. The constitution of the third embodiment is as follows. The semiconductor device 10 contains the semiinsulating substrate 12. The layered structure 20 of compound semiconductor containing the active channel layer 14 is provided on the semiinsulating substrate 12. The layered structure 20 of this example contains a plurality of layers 13, 14, 15, and 16, which are successively laid on the substrate. In this example, the InAlAs buffer layer 13 is provided on the InP substrate 12, which is a semiinsulating substrate. The active channel layer 14 (electron transit layer), i.e. InGaAs active channel layer 14 in this example, is provided on the InAlAs buffer layer 13.

The donor layer (electron supplying layer), which is InAlAs donor layer 15 in this example, is provided on the InGaAs active channel layer 14. The n+-InGaAs capping layer 16, which is a contact layer to connect with ohmic metals, is provided as the most upper layer of the layered structure 20. This layered structure 20 is a main element of the semiconductor device 10, and is formed as the mesa structure 18. More specifically, this mesa structure 18 contains a part of the InAlAs buffer layer 13, the active channel layer 14, the donor layer 15, and the n+-InGaAs capping layer 16. The first and the second metal main electrodes 22a and 22b, which are ohmic metals, i.e. a source electrode or a drain electrode, are provided on the upper surface of the n+-InGaAs capping layer 16, which constitutes the mesa structure.

The first and the second metal main electrodes 22a and 22b are disposed on the upper surface 16x, being away from each other. In the semiconductor device 10 of the third embodiment, the air-gap 42 is opened in the inner region surrounded by the two pairs of facing edges 18b and 18c of the mesa structure, which are exposed between the first and the second metal main electrodes 22a and 22b, directly surrounding the active channel layer 14. In other words, this air-gap 42 is provided as a space to isolate the active channel layer 14 from the tilted side surface 18a of the mesa structure 18. In addition, this air-gap 42 is also provided as a gap to isolate the InAlAs buffer layer 13 and the InAlAs donor layer 15 from each other.

The range of the region surrounded by the two pairs of facing edges 18b and 18c, where the air-gap 42 is formed, should be set not to degrade the performance of the semiconductor device 10. In the example illustrated in the figure, the range of the air-gap along the edges 18b and 18c extends in the whole gap of the first and the second metal main electrodes 22a and 22b. However, the air-gap can be provided only in the region right under the metal control electrode 26, having the same width as that of the outline of the metal electrode 26 on the top view.

The interlayer spacer film 30 to cover the layered structure 20 of compound semiconductor and the first and the second metal main electrodes on the InAlAs buffer layer 13 is provided thereon. The interlayer spacer film 30 is provided to seal the air-gap 42 by filling a part of the cavity 42' toward the inside of the mesa structure from the respective side surface 18a sides of the mesa structure 18.

The long opening 30a, which penetrates the interlayer spacer film 30 in the thickness direction and extends along the facing edges 23a and 23b, is provided between the first and the second main electrodes. This opening 30a is provided in the region between the first and the second metal main electrodes 22a and 22b. The n+- InGaAs capping layer 16, which is provided right under the opening 30a, has the recess 17, which connects to the opening 30a and exposes the InAlAs donor layer 15 being along the opening 30a.

The metal control electrode 26 is provided between the first and the second metal main electrodes 22a and 22b on the exposed region of the upper surface 16x of the n+-InGaAs capping layer 16. This metal control electrode 26 perpendicularly crosses the edges 18b of the mesa structure 18, which are exposed between the first and the second metal main electrodes 22a and 22b, and vertically crosses the upper surface 16x of the capping layer 16. In other words, the metal control electrode 26 extends to the outside the mesa structure 18, crossing over the two facing edges 18c and 18c.

As described above, the air-gap 42 is formed in the semiconductor device 10 of this embodiment. Since the active channel layer 14 and the metal control electrode 26 are isolated from each other with the air-gap 42, increase of gate leakage current can be effectively prevented. Therefore, increase of gate leakage current can be more effectively prevented in comparison with the constitution of the semiconductor device 10 of the second embodiment. In addition, the reliability of operation of the element can be further improved.

3-2. Method of Manufacturing the Semiconductor Device

Referring now to FIGS. 23-29, the method of manufacturing the semiconductor device of the third embodiment, which is described referring to FIGS. 22(A)-22(C), will be described below. Here, if the materials or conditions in the processes are similar to those in the first or the second embodiment, detailed explanation will be omitted. FIG. 23(A) is a schematic top view illustrating the process of manufacturing the semiconductor device of the third embodiment. FIG. 23(B) is a schematic cross-sectional view of the semiconductor device in the manufacturing process, which is taken along the line II-II' of FIG. 23(A). FIG. 24(A) is a schematic top view of the semiconductor device in the process after the one of FIG. 24(A). FIG. 24(B) is a schematic cross-sectional view taken along the line II-II' of FIG. 24(A). FIG. 25(A) is a schematic top view of the semiconductor device in the process after the one of FIG. 24(A). FIG. 25(B) is a schematic cross-sectional view taken along the line II-II' of FIG. 25(A). FIG. 26(A) is a schematic top view of the semiconductor device in the process after the one of FIG. 25(A). FIG. 26(B) is a schematic cross-sectional view taken along the line II-II' of FIG. 26(A). FIG. 27(A) is a schematic top view of the semiconductor device in the process after the one of FIG. 26(A). FIG. 27(B) is a schematic cross-sectional view taken along the line II-II' of FIG. 27(A). FIG. 28(A) is a schematic top view of the semiconductor device in the process after the one of FIG. 27(A). FIG. 28(B) is a schematic cross-sectional view taken along the line II-II' of FIG. 28(A). FIG. 29(A) is a schematic top view of the semiconductor device in the process after the one of FIG. 28(A). FIG. 29(B) is a schematic cross-sectional view taken along the line II-II' of FIG. 29(A).

Similarly to the first embodiment, also in the example of the constitution of the third embodiment, the layered structure 20 of compound semiconductor, which is formed as the mesa structure 18 containing the active channel layer 14, is provided on the semiinsulating substrate 12. The difference of the semiconductor device 10 of the third embodiment from the semiconductor devices of the first and the second embodiments is forming a space, i.e. air-gap 42, in place of providing the first and the second mesa ion implantation regions.

Figure 23A:
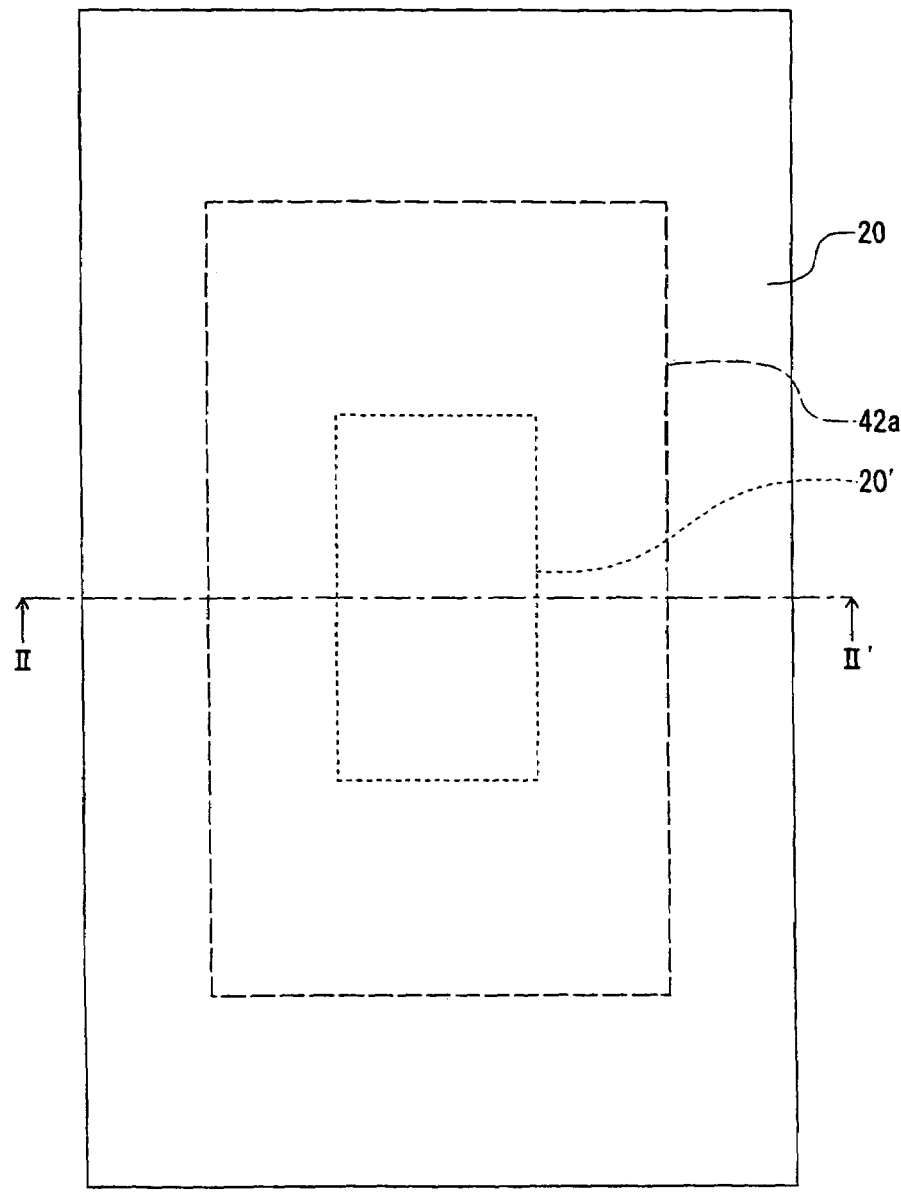
FIG. 23(A) is a schematic top view illustrating the process of manufacturing the semiconductor device of the third embodiment.
Figure 23B:
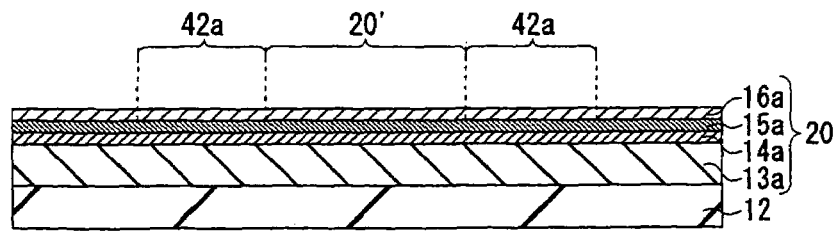
FIG. 23(B) is a schematic cross-sectional view of the semiconductor device in the manufacturing process, which is taken along the line II-II' of FIG. 23(A).

As shown in FIGS. 23(A) and 23(B), the layered structure 20 (13a, 14a, 15a and 16a) of compound semiconductor is formed on the substrate 12, and the air-gap (space) forming region 42a, which surrounds the active layer forming region 20' and the circumferential area, is set on the layered structure 20 in advance.

Figure 24A:
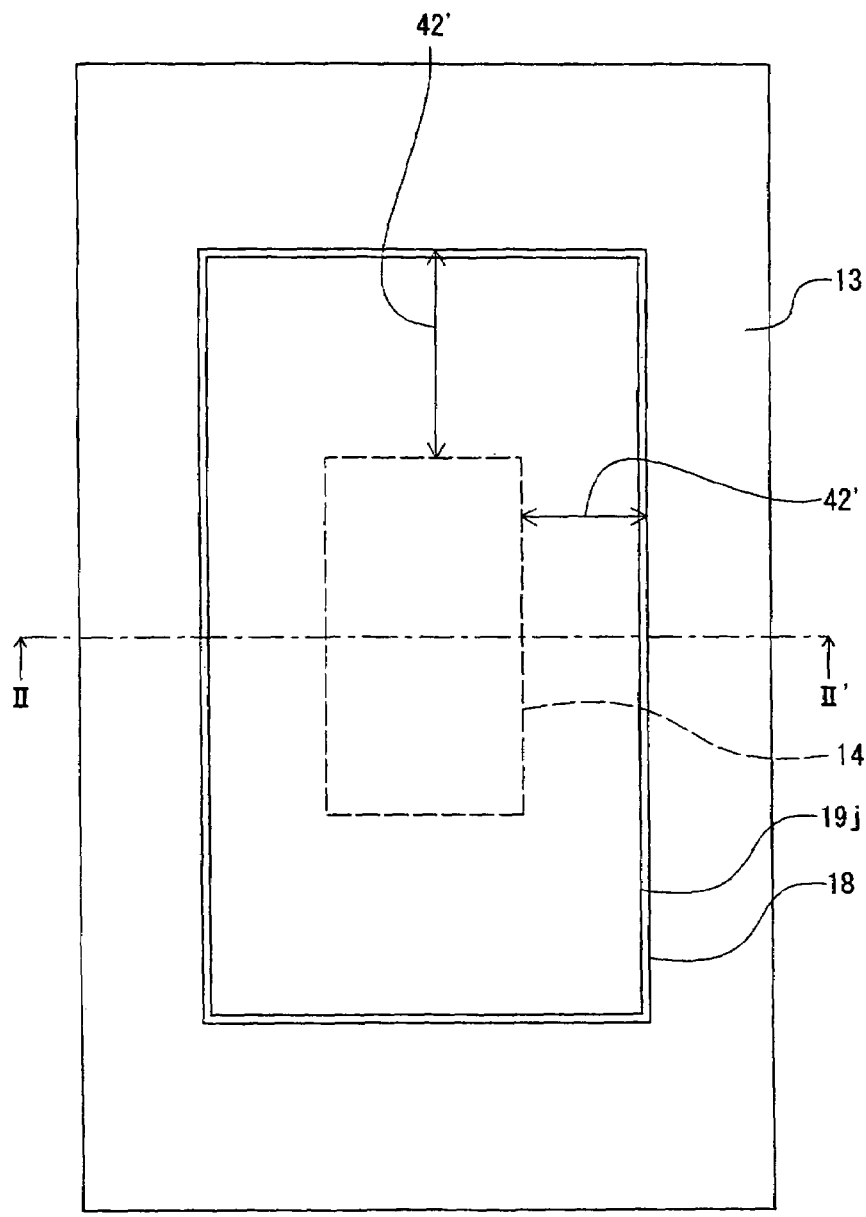
FIG. 24(A) is a schematic top view of the semiconductor device in the process after the one of FIG. 24(A).
Figure 24B:
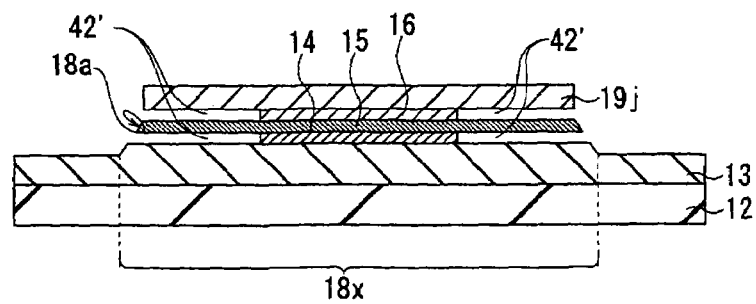
FIG. 24(B) is a schematic cross-sectional view taken along the line II-II' of FIG. 24(A).

Then, as shown in FIGS. 24(A) and 24(B), the resist layer 19j for forming active layer and air-gap (resist layer) is formed so as to cover the active layer forming region 20' and the air-gap forming region 42a, which are partial regions of the upper surface of the layered structure 20.

Thereafter, the layered structure 20 is etched. In the constitution of this example, similarly to the first embodiment, the mesa structure 18 is formed by performing mesa etching using the resist layer 19j (resist pattern) for forming the active layer and air-gap as a mask (See FIGS. 11(A) and 11(B)).

Then, InGaAs/InAlAs selective etching is performed onto the mesa structure 18, using the resist pattern 19j for forming the active layer and the air-gap as a mask, so as to obtain the modified mesa structure 18x. This InGaAs/InAlAs selective etching is preferably performed at normal temperature (25° C.) using a citric acid-based etchant. By this selective etching, the preliminary buffer layer 13a, the preliminary active channel layer 14a, the preliminary donor layer 15a and the preliminary capping layer 16a are respectively etched, and respectively become the buffer layer 13, the active channel layer 14, the donor layer 15 and the capping layer 16, which form the modified mesa structure 18x. Furthermore, in the constitution of this example, the circumferential portion (side surfaces 18a) of the active channel layer 14 and the capping layer 16 are etched more toward the center of each layer than the buffer layer 13 and the donor layer 15. As a result, the circumferential walls of the active channel layer 14, which is between the buffer layer 13 and the donor layer 15, are evenly arranged inward in comparison with those of the buffer layer 13 and the donor layer 15. Similarly, the capping layer 16 also remains having almost same size and shape as those of the active channel layer 14 under the donor layer, being arranged corresponding to the arrangement of the active channel layer.

According to the above process, a space is formed in a region surrounded by two pairs of edges 18b, 18b, and 18c, 18c (FIG. 22(A)) of the modified mesa structure 18x exposed between the first and the second metal main electrodes. The space is provided so as to directly surround the active channel layer 14, and is opened on the side surfaces 18a of the mesa structure 18. This space 42' isolates the active channel layer 14 from the side surfaces 18a of the modified mesa structure 18x. In addition, this space 42' also isolates the InAlAs buffer layer 13 and the InAlAs donor layer 15 from each other. The range for forming the space 42' inside the region surrounded by the edges 18b and 18b can be any as long as the performance of the semiconductor device is not degraded.

Figure 25A:
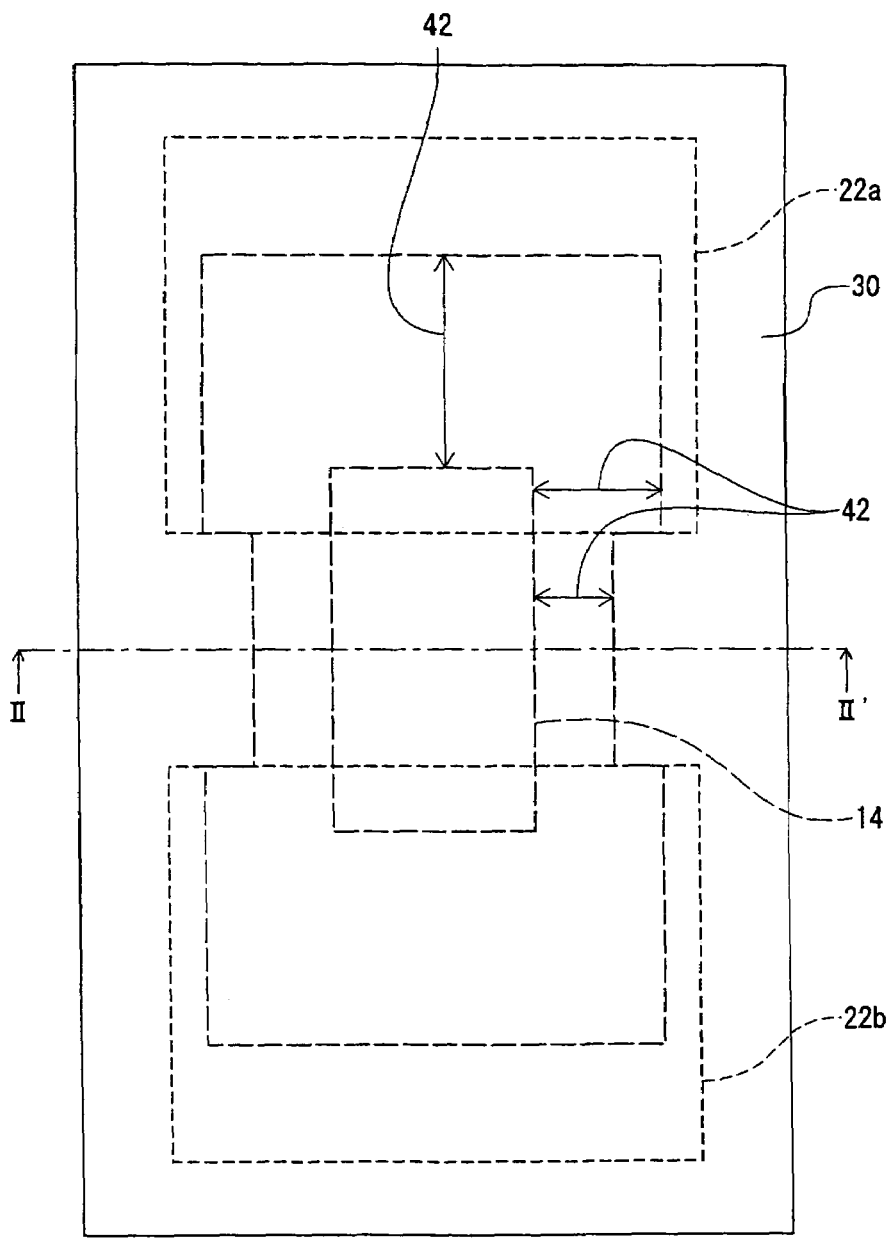
FIG. 25(A) is a schematic top view of the semiconductor device in the process after the one of FIG. 24(A).
Figure 25B:
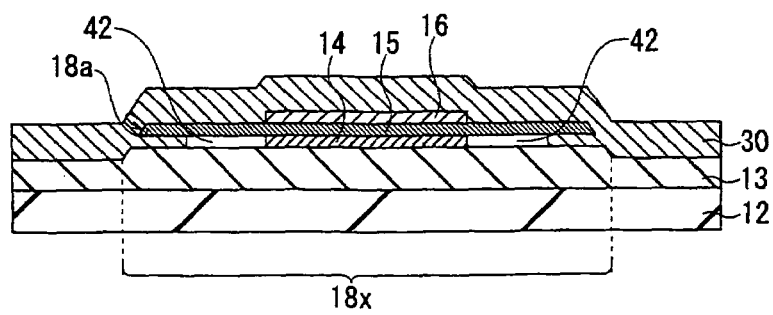
FIG. 25(B) is a schematic cross-sectional view taken along the line II-II' of FIG. 25(A).

Then, the first and the second metal main electrodes 22a and 22b, which are away from each other, are formed on the modified mesa structure 18x. Then, as shown in FIGS. 25(A) and 25(B), the interlayer spacer film 30 is formed on the whole surface of the buffer layer 13, including the exposed surfaces of the modified mesa structure 18x and the first and the second metal main electrodes 22a and 22b. At this time, the interlayer spacer film 30 gets into a part of the lower space 42' of the mesa structure 18, which is a space between the buffer kllayer 13 and the donor layer 15 of the modified mesa structure 18x, from the surrounding region of the modified mesa structure 18. As a result, the cavity 42' is sealed from the outside by the interlayer spacer film 30, and the air-gap as a closed space is formed therein.

Thereafter, as shown in FIGS. 26 and 27, similarly to the first embodiment, the slit first opening 30a which continuously exposes a part of the surface 16x of the capping layer 16 and a part of the donor layer 15, is formed on the interlayer insulating film 30 in the direction vertical to the distance between the first and the second metal main electrodes 22a and 22b, using the resist pattern 19c. Furthermore, as shown in FIG. 28, a part of the capping layer 16 exposed from the first opening 30a is etched to the depth not to reach the active channel layer 14, using the resist pattern 19d, and the recess 17 having larger width in the direction between the electrodes than that of the first opening 30a is formed.

Then, as shown in FIG. 29, the metal control electrode 26, which is upright on the bottom surface of the recess 17, penetrates the first opening 30a, and crosses the donor layer 15 in the extending direction of the first opening 30a, is formed. According to the above-described series of the processes, the semiconductor device 10 of the third embodiment is manufactured. By manufacturing the semiconductor device 10 as described above, the active channel layer can be more securely protected. More specifically, similarly to the effects of the first embodiment, the active channel layer 14 is protected by the air-gap 42, which is sealed by the interlayer spacer film's getting into a part of the cavity at the time of recess etching for forming the metal control electrode 26. Therefore, reduction or loss of the performance of the active channel layer 14 due to the contamination of the active channel layer 14 by the etchant used in the recess etching process can be prevented.

Here, the semiconductor device 10 of this invention is not limited to the ones described above, but generally, it can be applied to any field effect transistor device, which employs a mesa structure for device isolation, i.e. MESFET and HEMT. For example, it can be applied to the one which performs device isolation by the mesa structure, such as InP-based HEMT, metamorphic HEMT, or strained channel InP-based p-HEMT and GaAs-based MESFET. In addition, in the description of the embodiments, single-recessed HEMTs are described as examples, but the present invention is also applicable to so-called "double-recessed HEMT".

According to the constitution of the electrical field transistor element of this invention, increase of gate leakage current due to low Schottky barrier can be effectively prevented, while achieving satisfactory isolation characteristics by the mesa structure. In addition, according to the manufacturing method of this invention, since the active channel layer is not exposed and protected at the time of performing so-called recess etching process for forming the metal control electrode, the reduction or loss of the performance of the active channel layer due to contamination of the active channel layer by the etchant can be prevented.

The invention claimed:

1. A semiconductor device, comprising:
    a semiinsulating substrate;
    a layered structure of compound semiconductor, which is provided on said semiinsulating substrate as a mesa structure, and contains an active channel layer as an intermediate layer, said mesa structure having a pyramid shape with a rectangular base;
    first and second metal main electrodes, which are provided on an upper surface of said mesa structure being away from each other in a channel length direction on an upper surface of said mesa structure and extending down along respective sides of said mesa structure so as to have inclined portions relative to said substrate;
    a metal control electrode provided between the first metal main electrode and the second metal main electrode; and
    first and second ion implantation regions, which are provided at edge sections of said mesa structure between said first and second metal main electrodes, facing each other in a channel width direction, and extending from an upper surface of said mesa structure to a depth level below said active channel layer, said first ion implantation region and said second ion implantation region being situated under the metal control electrode and away from the first metal main electrode and the second metal main electrode,
    wherein said first and second ion implantation regions isolate said active channel layer from said metal control electrode so as to prevent said metal control electrode from contacting said active channel layer.

2. A semiconductor device, comprising:
    a semiinsulating substrate;
    a layered structure of compound semiconductor, which is provided on said semiinsulating substrated as a mesa structure having a pyramid shape with a rectangular base, and contains an active channel layer and a donor layer, which forms a hetero-junction with said active channel layer, as intermediate layers;

first and second metal main electrodes, which are provided on an upper surface of said mesa structure being away from each other in a channel length direction and extending down along respective sides of said mesa structure so as to have inclined portions relative to said substrate;

a metal control electrode provided between the first metal main electrode and the second metal main electrode; and first and second ion implantation regions, which are provided at edge sections of said mesa structure between said first and second main metal electrodes, facing each other in a channel width direction, and extending from an upper surface of said mesa structure to a depth level below said active channel layer, said first ion implantation region and said second ion implantation region being situated under the metal control electrode and away from the first metal main electrode and the second metal main electrode, wherein said first and second ion implantation regions isolate said active channel layer from said metal control electrode so as to prevent said metal control electrode from contacting said active channel layer.

3. A. semiconductor device, comprising:

an InP substrate;

a layered structure of compound semiconductor, which is formed as a mesa structure, and contains InAlAs buffer layer, InGaAs active channel layer provided on said InAlAs buffer layer, InAlAs donor layer formed on said InGaAs active channel layer, and an n+-InGaAs capping layer formed on said InAlAs donor layer;

first and second metal main electrodes, which are provided on said layered structure, being away from each other on an upper surface of said n+-InGaAs capping layer;

a metal control electrode provided on the InAlAs donor layer between the first metal main electrode and the second metal main electrode, said metal control electrode penetrating the n+-InGaAs capping layer without contact;

first and second ion implantation regions, which are provided at edge sections of said mesa structure between said first and second metal main electrodes, facing each other ion a channel width direction, extending from an upper surface of said capping layer to a depth level below said InGaAs active channel layer, and disposed at only sides of said InGaAs active channel layer that do not constitute ends thereof; and an interlayer spacer film provided on an upper side of said mesa structure including said first and second metal main electrodes, wherein said metal control electrode extends along said channel width direction to inside of said first and second ion implantation regions, and also extends on said interlayer spacer film to outside of said mesa structure.

4. The semiconductor device according to claim 1, 2, or 3, wherein said first and second ion implantation regions extend from under said mesa structure to beyond a perimeter of said mesa structure in said channel width direction.

5. The semiconductor device according to claim 1, 2, or 3, wherein said first and second ion implantation regions are regions provided from an edge sections on an upper surface of said mesa structure into 0.5-1 µm inner region on a top view.

6. The semiconductor device according to claim 1, 2, or 3, wherein said first and second ion implantation regions are semiinsulating regions, where boron (B) ions or oxygen (O) ions are implanted.

* * * * *